US006853268B2

(12) United States Patent
Harada

(10) Patent No.: US 6,853,268 B2
(45) Date of Patent: Feb. 8, 2005

(54) NOISE FILTER

(75) Inventor: Toru Harada, Yokohama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/644,780

(22) Filed: Aug. 21, 2003

(65) Prior Publication Data

US 2004/0070468 A1 Apr. 15, 2004

(30) Foreign Application Priority Data

Aug. 21, 2002 (JP) ....................................... 2002-240906
Jul. 24, 2003 (JP) ....................................... 2003-201298

(51) Int. Cl.$^7$ .................................................. H03H 7/03
(52) U.S. Cl. ......................... 333/185; 333/12; 333/116; 333/184
(58) Field of Search ................................ 333/12, 21 R, 333/116, 181, 183, 184, 185

(56) References Cited

U.S. PATENT DOCUMENTS 3,663,902 A * 5/1972 Deutscher et al. ........ 333/99 S
5,625,169 A * 4/1997 Tanaka ....................... 174/250
6,148,221 A * 11/2000 Ishikawa et al. ............ 505/210
6,806,794 B2 * 10/2004 Yamamoto et al. ......... 333/185

* cited by examiner

*Primary Examiner*—Robert Pascal
*Assistant Examiner*—Dean Takaoka
(74) *Attorney, Agent, or Firm*—Keating & Bennett, LLP

(57) ABSTRACT

A noise filter includes four magnetic layers including upper and lower magnetic layers and intermediate magnetic layers which are laminated to define a laminated unit. Two signal lines are disposed side by side between the intermediate magnetic layers, and two ground electrodes sandwich the intermediate magnetic layers therebetween so as to form a transmission line. A dielectric member is disposed between the two signal lines. With this configuration, a common-mode signal is attenuated by utilizing magnetic loss in the magnetic layers. In contrast, by providing the dielectric member, a normal-mode signal is allowed to propagate by reducing the effective relative magnetic permeability while preventing the occurrence of blunt waves.

22 Claims, 24 Drawing Sheets

NOISE FILTER

BACKGROUND OF THE INVENTION

1. Field of the Invention

The present invention relates to noise filters for use in electronic circuits utilizing differential signals, such as in high-speed differential interfaces.

2. Description of the Related Art

Generally, an electronic circuit utilizing differential signals (normal-mode signals) includes two differential lines. Due to various reasons, common-mode noise (common-mode signal), which causes radiation of electromagnetic noise, disadvantageously flows in these differential lines. Accordingly, a common-mode choke coil which defines a noise filter is connected to a mid-portion of the differential lines so as to permit the normal-mode signal to pass through and to reflect the common-mode signal, thereby eliminating common-mode noise.

In the above-described related art, noise is suppressed by reflection loss. Accordingly, if a noise filter is disposed in a mid-portion of the lines that connect the circuits, noise having a specific frequency often resonates between the noise filter and a peripheral circuit, which increases the noise despite the noise filter.

The signal frequency used in digital devices is increasing, and there is an increased number of electronic devices using signal frequencies of at least 100 MHz. Thus, the frequency of common-mode noise is also increasing, and the line length between the noise filter and a peripheral component or the line length between a plurality of components is vulnerable to the noise. Accordingly, in known noise filters, noise cannot be sufficiently eliminated due to the influence of the resonant frequency caused by the reflection, and signal waveforms are distorted. Thus, in electronic devices using high frequency signals, noise filters that eliminate noise by utilizing reflection loss cannot be effectively used.

There is a noise filter which includes a chip coil in which two lines are embedded in a medium, for example, in ferrite. In this case, if the attenuation (permeability) ratio of one of the common-mode signal and the normal-mode signal is set, the attenuation ratio of the other mode signal is also set since the two lines are disposed in the medium, which is uniform. It is thus difficult to set the attenuation ratio for each of the mode signals.

SUMMARY OF THE INVENTION

To overcome the problems described above, preferred embodiments of the present invention provide a small noise filter in which the attenuation ratio for each of the mode signals can be set while preventing resonance noise.

According to one preferred embodiment of the present invention, a noise filter includes a transmission line including an insulating medium formed of an insulating material, two signal lines provided on the insulating medium with a space therebetween, and a ground electrode. Between a common-mode signal in which the directions of currents flowing in the two signal lines are the same and a normal-mode signal in which the directions of currents flowing in the two signal lines are different, one of the common-mode signal and the normal-mode signal, which is not desired, is eliminated. An additional medium which is made of a material that is different from the insulating medium is disposed at a location of only one of an electromagnetic field substantially generated by the common-mode signal and an electromagnetic field substantially generated by the normal-mode signal, thereby adjusting loss of the common-mode signal or the normal-mode signal for which the additional medium is disposed.

With this configuration, the signals propagate in the transmission line via the insulating medium such that they are attenuated by utilizing thermal loss in the insulating medium. Since the two signal lines are disposed side by side with a spacing therebetween, the electromagnetic fields generated by the signals in the signal lines mutually influence each other between the signal lines. Accordingly, the electromagnetic field distribution in the insulating medium is different between the common mode and the normal mode, and thus, the attenuation of the common-mode signal and the attenuation of the normal-mode signal are different.

An additional medium which is made of a material that is different from the insulating medium is disposed at a location of only one of the electromagnetic field substantially generated by the common-mode signal and the electromagnetic field substantially generated by the normal-mode signal. By providing this additional medium, the effective material characteristics (frequency characteristics) are changed between the modes. As a result, the attenuation for each of the mode signals can be adjusted, and the loss of the signal of the desired mode is decreased, while the loss of the signal of the undesired mode is increased.

If a material having a relative magnetic permeability that is less than the insulating medium is disposed as the additional medium at a location in which only a magnetic field of the desired mode is generated, the frequency characteristics of the effective relative magnetic permeability for the signal of the desired mode can be changed. Accordingly, for the signal of the desired mode, the frequency at which the loss peaks is shifted to a higher frequency range. Thus, the signal of the undesired mode is removed in a low frequency range, and the signal of the desired mode passes through the filter without being attenuated up to the high frequency range and without causing blunt waves.

According to another preferred embodiment of the present invention, a noise filter includes a transmission line including an insulating medium including a plurality of overlaid insulating layers, two signal lines disposed between the corresponding insulating layers with a space therebetween, and two ground electrodes sandwiching the corresponding insulating layers including the two signal lines. Between a common-mode signal in which the directions of currents flowing in the two signal lines are the same and a normal-mode signal in which the directions of currents flowing in the two signal lines are different, one of the common-mode signal and the normal-mode signal, which is not desired, is eliminated. An additional medium which is made of a material that is different from the insulating medium is disposed at a location of only one of an electromagnetic field substantially generated by the common-mode signal and an electromagnetic field substantially generated by the normal-mode signal, thereby adjusting the loss of the common-mode signal or the normal-mode signal for which the additional medium is disposed.

With this configuration, since the two signal lines are disposed between the corresponding insulating layers, the signals propagating in the transmission line are attenuated by utilizing thermal loss in the insulating layers. An additional medium which is made of a material different from the insulating medium is disposed at a location of only one of the electromagnetic field substantially generated by the common-mode signal and the electromagnetic field substantially generated by the normal-mode signal. By providing this additional medium, the effective material characteristics are changed between the modes. As a result, the attenuation for each of the mode signals can be adjusted, and the loss of the signal of the desired mode is decreased, while the loss of the signal of the undesired mode is increased.

The normal-mode characteristic impedance of the transmission line can be set by suitably adjusting the widths of the signal lines, the thickness of the insulating layers, the material characteristics, etc. Additionally, the signal lines are disposed between the corresponding insulating layers, and the two ground electrodes sandwich the insulating layers including the two signal lines therebetween. Accordingly, the transmission line can be arranged such that the entire length of the signal lines is covered with the ground electrodes. Thus, the common-mode characteristic impedance is maintained at a constant value over the entire transmission line, thereby preventing noise from being reflected in the transmission line and also preventing noise resonance and the distortion of the waveform. Since the signal lines are entirely covered with the ground electrodes, noise is prevented from entering the signal lines from the exterior, thereby enhancing the transmission reliability of the signals.

By providing the additional medium in the insulating medium, the normal-mode characteristic impedance and the common-mode characteristic impedance can be individually set. While normal-mode characteristic impedance matching to an external circuit is provided, common-mode characteristic impedance matching to the external circuit may or may not be provided. If common-mode characteristic impedance matching is not provided, noise is suppressed by utilizing reflection loss. If common-mode characteristic impedance is provided, noise is suppressed by utilizing thermal loss in the insulating layers while preventing problems, for example, resonance, caused by the reflection.

Regardless of whether or not common-mode characteristic impedance is provided, the common-mode characteristic impedance can be set independently of the normal-mode characteristic impedance. Accordingly, the transmission loss for the common-mode signal is increased as compared to the related art by utilizing reflection loss and/or thermal loss. In particular, in the configuration of preferred embodiments of the present invention, there is no insertion-loss resonance point in the high frequency range (several hundred megahertz or higher), which is observed in the related art, thereby making it possible to attenuate noise up to about 10 GHz. Normal-mode characteristic impedance matching to an external circuit is provided more easily than in the related art, thereby reducing the influence of, for example, resonance, on the waveform of the normal-mode signal.

According to still another preferred of the present invention, a noise filter includes a plurality of transmission lines, each of which includes an insulating medium including a plurality of overlaid insulating layers, first and second signal lines disposed between the corresponding insulating layers with a space therebetween, and two ground electrodes disposed on the uppermost surface and the lowermost surface of the transmission line by sandwiching the corresponding insulating layers including the first and second signal lines, the first signal lines being connected in series with each other and the second signal lines being connected in series with each other between the plurality of transmission lines. Between a common-mode signal in which the directions of currents flowing in the two signal lines are the same and a normal-mode signal in which the directions of currents flowing in the two signal lines are different, one of the common-mode signal and the normal-mode signal, which is not desired, is eliminated. An additional medium which is made of a material that is different from the insulating medium is disposed at a location of only one of an electromagnetic field substantially generated by the common-mode signal and an electromagnetic field substantially generated by the normal-mode signal, thereby adjusting loss of the common-mode signal or the normal-mode signal for which the additional medium is disposed.

With this configuration, since the two signal lines are disposed between the corresponding insulating layers, the signals propagating in the transmission line are attenuated by utilizing thermal loss in the insulating layers. An additional medium which is made of a material that is different from the insulating medium is disposed at a location of only one of the electromagnetic field substantially generated by the common-mode signal and the electromagnetic field substantially generated by the normal-mode signal. By providing this additional medium, the effective material characteristics are changed between the modes. As a result, the attenuation for each of the mode signals can be adjusted, and the loss of the signal of the desired mode is decreased, while the loss of the signal of the undesired mode is increased.

Additionally, since the ground electrodes are disposed on the uppermost layer and the lowermost layer of the transmission line, the signal lines are disposed between the corresponding insulating layers, and also, the entire length of the signal lines is covered with the two ground electrodes. It is also possible to prevent noise from entering the transmission line from the exterior, thereby enhancing the transmission reliability of the signals.

If the widths of the signal lines are set to be substantially equal to each other, and also, if the thickness of the insulating layers and the material characteristics are set to be substantially equal to each other, the common-mode characteristic impedances of the transmission lines are substantially the same, and also, the normal-mode characteristic impedances of the transmission lines are substantially the same. Accordingly, the common-mode characteristic impedance is maintained substantially at a constant value over the entire transmission lines connected in series with each other. As a result, noise is prevented from being reflected in the transmission line, and also noise resonance and the distortion of the waveform is prevented.

By providing the additional medium in the insulating medium, the normal-mode characteristic impedance and the common-mode characteristic impedance can be individually set. While normal-mode characteristic impedance matching to an external circuit is provided, common-mode characteristic impedance matching to the external circuit may or may not be provided. If common-mode characteristic impedance matching is not provided, noise is suppressed by utilizing reflection loss. Regardless of whether or not common-mode characteristic impedance is provided, the common-mode characteristic impedance is set independently of the normal-mode characteristic impedance. Accordingly, the transmission loss for the common-mode signal is increased as compared to the related art by utilizing reflection loss and/or thermal loss. In particular, in the configuration of preferred embodiments of the present invention, there is no insertion-loss resonance point in the high frequency range (several hundred megahertz or higher), which is observed in the related art, thereby making it possible to attenuate noise up to about 10 GHz. Normal-mode characteristic impedance matching to an external circuit is provided more easily than the related art, thereby reducing the influence of, for example, resonance, on the waveform of the normal-mode signal.

The transmission lines are preferably connected in series with each other between the plurality of layers. Accordingly, the overall length of the signal lines is increased, and the attenuation of noise passing through the signal lines is increased.

According to a further preferred embodiment of the present invention, a noise filter includes a transmission line including a layered insulating medium, two signal lines disposed on the obverse surface of the insulating medium with a space therebetween, and a ground electrode disposed on the reverse surface of the insulating medium. Between a common-mode signal in which the directions of currents flowing in the two signal lines are the same and a normal-mode signal in which the directions of currents flowing in the two signal lines are different, one of the common-mode signal and the normal-mode signal, which is not desired, is eliminated. An additional medium which is made of a material different from the insulating medium is disposed at a location of only one of an electromagnetic field substantially generated by the common-mode signal and an electromagnetic field substantially generated by the normal-mode signal, thereby adjusting loss of the common-mode signal or the normal-mode signal for which the additional medium is disposed.

The two signal lines are disposed on the obverse surface of the insulating medium, and thus, the signals propagating in the transmission line are attenuated by utilizing thermal loss in the insulating medium. An additional medium which is made of a material that is different from the insulating medium is disposed at a location of only one of the electromagnetic field substantially generated by the common-mode signal and the electromagnetic field substantially generated by the normal-mode signal. By providing this additional medium, the effective material characteristics are changed between the modes. As a result, the attenuation for each of the mode signals can be adjusted, and the loss of the signal of the desired mode is decreased, while the loss of the signal of the undesired mode is increased. Additionally, the transmission line is preferably formed by covering the entire length of the two signal lines with the ground electrode from the reverse surface of the insulating medium. Thus, the common-mode characteristic impedance is set to be a constant value over the entire transmission line, thereby preventing noise from being reflected in the transmission line and also preventing noise resonance.

By providing the additional medium in the insulating medium, the normal-mode characteristic impedance and the common-mode characteristic impedance can be individually set. While normal-mode characteristic impedance matching to an external circuit is provided, common-mode characteristic impedance matching to the external circuit may or may not be provided. Regardless of whether or not common-mode characteristic impedance is provided, the common-mode characteristic impedance is set independently of the normal-mode characteristic impedance. Accordingly, the transmission loss for the common-mode signal is increased as compared to the related art by utilizing reflection loss and/or thermal loss. In particular, in the configuration of the present invention, there is no insertion-loss resonance point in the high frequency range (several hundred megahertz or higher), which is observed in the related art, thereby making it possible to attenuate noise up to about 10 GHz. Normal-mode characteristic impedance matching to an external circuit is provided more easily than in the related art, thereby reducing the influence of, for example, resonance, on the waveform of the normal-mode signal.

In the noise filter, the additional medium may be disposed between the two signal lines. In this case, the two signal lines are disposed side by side with a space therebetween. Accordingly, in the common mode, a magnetic flux which entirely surrounds the two signal lines is formed. In the normal mode, however, magnetic fluxes which individually surround the two signal lines are formed. Thus, in the common mode, a magnetic flux is not formed between the two signal lines. In contrast, in the normal mode, a magnetic flux (magnetic field) which passes through the two signal lines is formed. Therefore, by disposing the additional medium between the two signal lines, only the magnetic fluxes of the normal mode is adjustable.

Additionally, in the common mode, an electric flux (electric field) is formed between the two signal lines and the ground electrode. In the normal mode, however, an electric flux connecting the two signal lines is formed. Therefore, by disposing the additional medium between the two signal lines, only the electric flux of the normal mode is adjustable.

Accordingly, the additional medium can be disposed at a position through which the magnetic flux or the electric flux of only the normal mode passes, thereby making it possible to adjust the effective relative magnetic permeability or the effective relative dielectric constant of the normal mode.

In the noise filter, the insulating medium may be formed of a magnetic medium made of a magnetic material, and the additional medium may be formed of a non-magnetic medium, a space, or a low-magnetic-permeability medium having a relative magnetic permeability less than the magnetic medium.

With this arrangement, the signals are attenuated by utilizing magnetic loss (thermal loss) of the magnetic medium. As the additional medium, a low-magnetic-permeability medium having a relative magnetic permeability that is less than the magnetic medium is disposed between the two signal lines. The frequency characteristics of the effective relative magnetic permeability for the normal mode, which is a desired mode, can be changed, and the frequency at which the loss peaks can be shifted to a higher frequency range. Accordingly, the common-mode signal is removed from the low frequency range, and the normal-mode signal propagates without being attenuated up to the high frequency range. Thus, the normal-mode signal is transmitted without causing blunt waves.

The insulating medium is preferably formed of a dielectric medium made of a dielectric material. An incision groove is preferably formed between the two signal lines on the obverse surface of the dielectric medium, and the additional medium is formed of a space defined in the incision groove.

With this arrangement, the signals are attenuated by utilizing dielectric loss (thermal loss) of the dielectric material. By providing the incision groove between the two signal lines, the effective relative magnetic permeability of the normal mode is decreased by the space defined in the incision groove, thereby making it possible to reduce the loss of the normal-mode signal.

The insulating medium is preferably formed of a magnetic medium made of a magnetic material. The additional medium is preferably disposed between the two signal lines and formed of a non-magnetic medium, a space, or a low-magnetic-permeability medium having a relative magnetic permeability less than the magnetic medium, and a coating film having a relative magnetic permeability greater than the additional medium preferably covers the additional medium and the two signal lines.

With this arrangement, the signals are attenuated by utilizing magnetic loss (thermal loss) of the magnetic medium and the coating film. As the additional medium, a low-magnetic-permeability medium having a relative magnetic permeability less than the magnetic medium is disposed between the two signal lines. The frequency characteristics of the effective relative magnetic permeability for the normal mode, which is a desired mode, can be changed, and the frequency at which the loss peaks is shifted to a higher frequency range. Accordingly, the common-mode signal is removed from the low frequency range, and the normal-mode signal can propagate without being attenuated up to the high frequency range. Thus, the normal-mode signal is transmitted without causing blunt waves.

The two signal lines are preferably formed in a meandering zigzag manner, or alternatively in a spiral shape. With this arrangement, the length of the signal lines is greater than that when the signal lines are linear, thereby making it possible to increase the attenuation of the signal of the undesired mode (noise).

Other features, elements, characteristics and advantages of the present invention will become more apparent from the following detailed description of preferred embodiments thereof with reference to the attached figures.

DETAILED DESCRIPTION OF PREFERRED EMBODIMENTS

Figure 1:
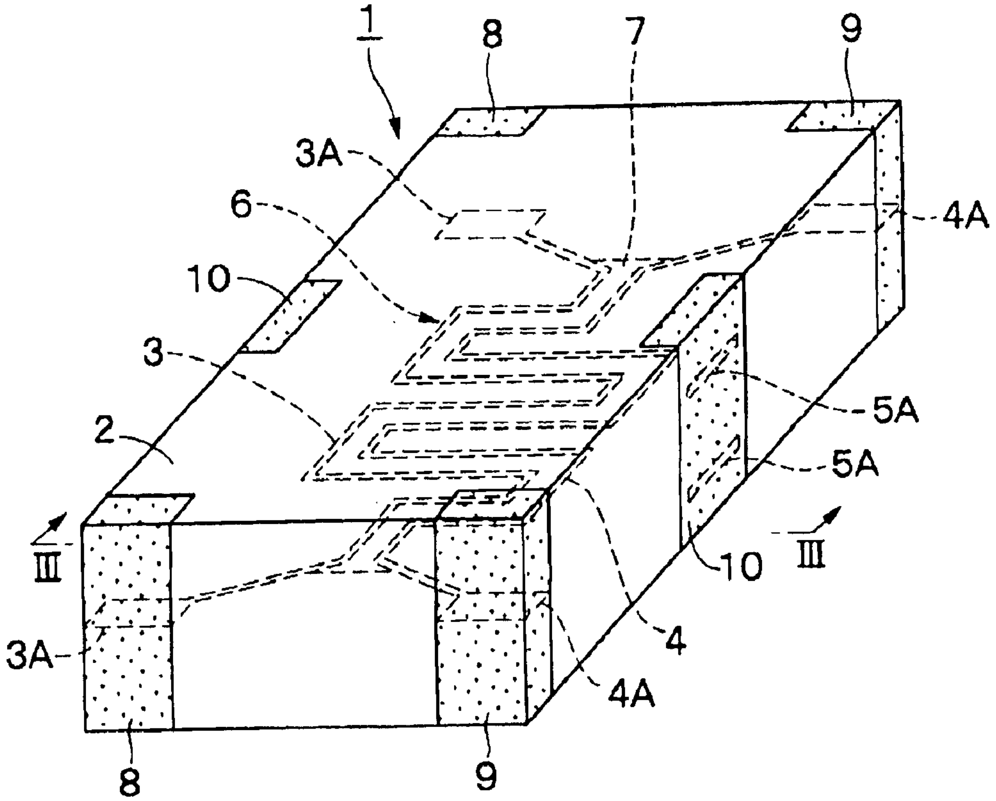
FIG. 1 is a perspective view illustrating a noise filter constructed in accordance with a first preferred embodiment of the present invention.
Figure 2:
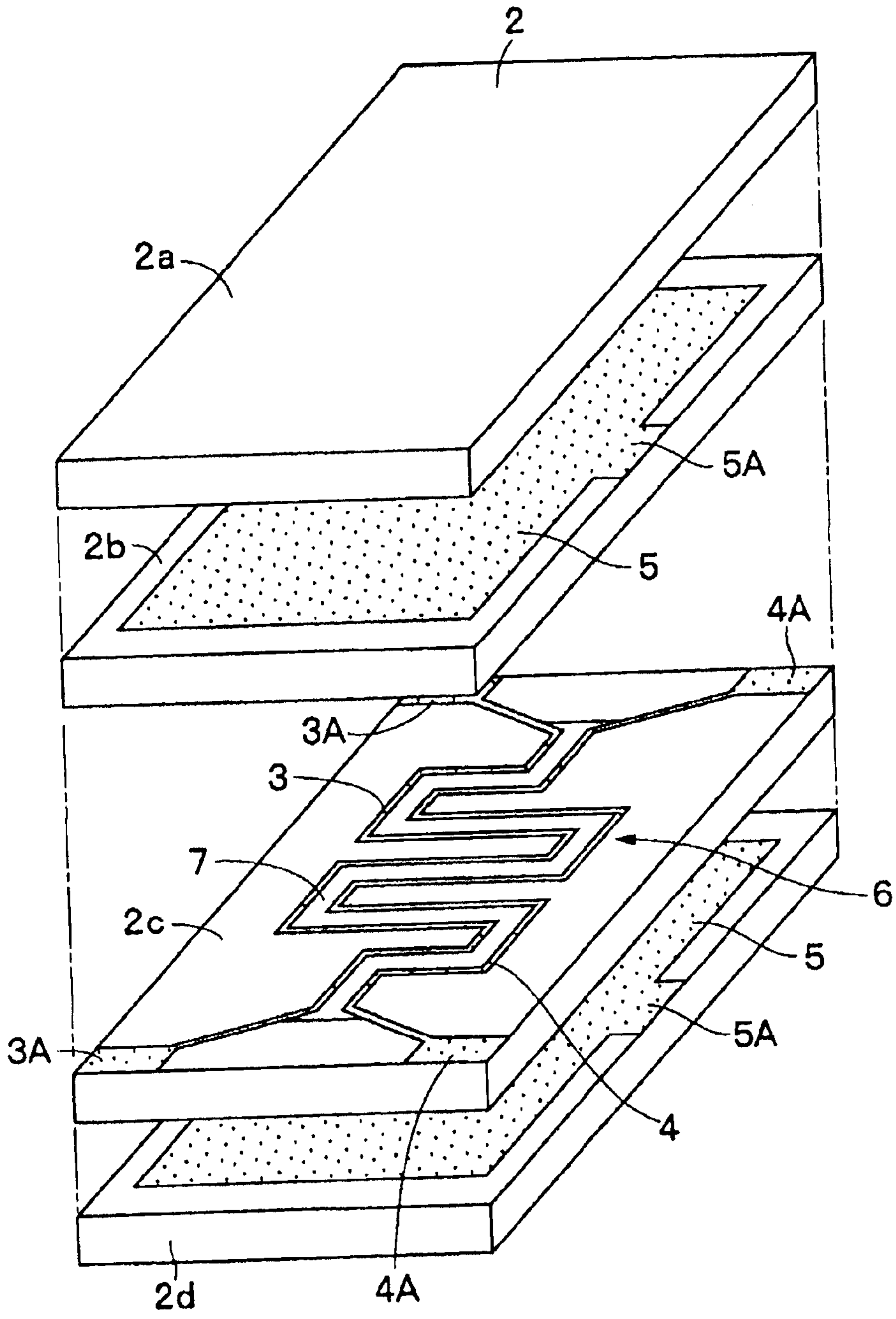
FIG. 2 is an exploded perspective view illustrating the noise filter shown in FIG. 1.

The present invention is described in detail below with reference to the accompanying drawings through illustration of preferred embodiments.

A noise filter 1 according to a first preferred embodiment of the present invention is described below with reference to FIGS. 1 through 9.

The noise filter 1 includes magnetic layers 2*a* through 2*d*, signal lines 3 and 4, ground electrodes 5, a dielectric member 7, signal electrode terminals 8 and 9, and ground electrode terminals 10, which are described below.

The magnetic layers 2*a* through 2*d* define a laminated unit 2 preferably having the shape of a prism, which serves as an insulating medium to define the outer shape of the noise filter 1. The magnetic layers 2*a* through 2*d*, which serve as insulating layers, are formed by laminating four magnetic sheets and then by pressing and firing them. The magnetic layers 2*a* through 2*d* are preferably formed in the shape of a flat quadrilateral by using a ceramic material (magnetic material) which exhibits magnetic characteristics, for example, ferrite. The relative magnetic permeability $\mu r0$ of the magnetic layers 2*a* through 2*d* is, for example, about 4 to about 1000 ($4 \leqq \mu r0 \leqq 1000$), and the relative dielectric constant $\epsilon r0$ is, for example, about 10.

It is not essential that a magnetic material be used for the magnetic layers 2*a* and 2*d*. For example, an insulating resin film may be used for the magnetic layer 2*a*, and an insulating ceramic substrate (insulating substrate), for example, an alumina substrate, may be used for the magnetic layer 2*d*. The magnetic layer 2*a* may be omitted. The ground electrode 5 provided on the obverse surface of the magnetic layer 2*d* in FIG. 2 may be formed on the reverse surface of the magnetic layer 2*c*, thereby also making it possible to omit the magnetic layer 2*d*. In order to reduce the manufacturing cost, the four magnetic layers 2*a* through 2*d* may be made of the same material.

Fired magnetic layers, for example, ferrite plates, may be used for the magnetic layers 2*a* through 2*d*. In this case, bonding layers which are thin enough not to influence the characteristics of the magnetic layers 2*a* through 2*d* may be used for coupling them.

The two signal lines 3 and 4 are disposed between the magnetic layers 2*b* and 2*c*. The signal lines 3 and 4 extend substantially parallel to each other with a predetermined spacing therebetween such that they extend back and forth along the width of the magnetic layers 2*b* and 2*c* in a zigzag manner (meandering) while extending in the longitudinal direction of the magnetic layers 2*b* and 2*c*. The signal lines 3 and 4 may alternatively extend back and forth in the longitudinal direction of the magnetic layers 2*b* and 2*c* so as to be extended along the width thereof. The signal lines 3 and 4 may be formed generally in a strip-like shape by using a conductive metal material, for example, a silver paste or palladium. Ends 3A of the signal line 3 and ends 4A of the signal line 4 are connected to the signal electrode terminals 8 and 9, respectively, which are described below.

The signal lines 3 and 4 are arranged substantially at the center of the thickness of the two ground electrodes 5, which are described below, and are substantially entirely covered with the ground electrodes 5 so as to form a transmission line 6. The signal lines 3 and 4 have substantially the same width, and the distance between the two ground electrodes 5 is maintained substantially at a constant value along the entire surface of the magnetic layers 2*b* and 2*c*. Since the characteristic impedance of the transmission line 6 is determined by the width of the signal lines 3 and 4, the distance between the ground electrodes 5, and the magnetic permeability and the dielectric constant of the magnetic layers 2*a* and 2*b*, it is maintained substantially at a constant value along the entire length of the transmission line 6.

The ground electrodes 5 disposed on the obverse surface of the magnetic layer 2*b* and the reverse surface of the magnetic layer 2*c* sandwich the magnetic layers 2*b* and 2*c*, which are arranged substantially at the center of the thickness of the noise filter 1, from the top and the bottom directions. The ground electrodes 5 are preferably formed generally in the shape of a flat quadrilateral by using a conductive metal material, for example, a silver paste or palladium, and cover substantially the entire surface of the magnetic layers 2*b* and 2*c*. Electrode portions 5A projecting in a tongue-like configuration in the widthwise direction (left and right sides in FIG. 2) of the ground electrodes 5 are provided at intermediate portions of the magnetic layers 2*b* and 2*c* in the longitudinal direction (front-to-back direction in FIG. 2). The electrode portions 5A are connected to the ground electrode terminals 10, which are described below. The ground electrodes 5 define the transmission line 6 together with the magnetic layers 2*b* and 2*c* and the signal lines 3 and 4, and are covered with the magnetic layers 2*a* and 2*d*.

The dielectric member 7 is formed of a non-magnetic medium, which is made of a material different from that for the magnetic layers 2*b* and 2*c*, and is disposed between the signal lines 3 and 4. The relative magnetic permeability $\mu r1$ of the dielectric member 7 is less than the relative magnetic permeability $\mu r0$ of the magnetic layers 2*b* and 2*c*, and is, for example, about 1 ($\mu r1 \approx 1$). The relative dielectric constant $\epsilon r\mathbf{1}$ of the dielectric member 7 is preferably substantially the same as the relative dielectric constant $\epsilon r\mathbf{0}$ of the magnetic layers 2*b* and 2*c*. The dielectric member 7 fills in the space between the two signal lines 3 and 4.

Figure 3:
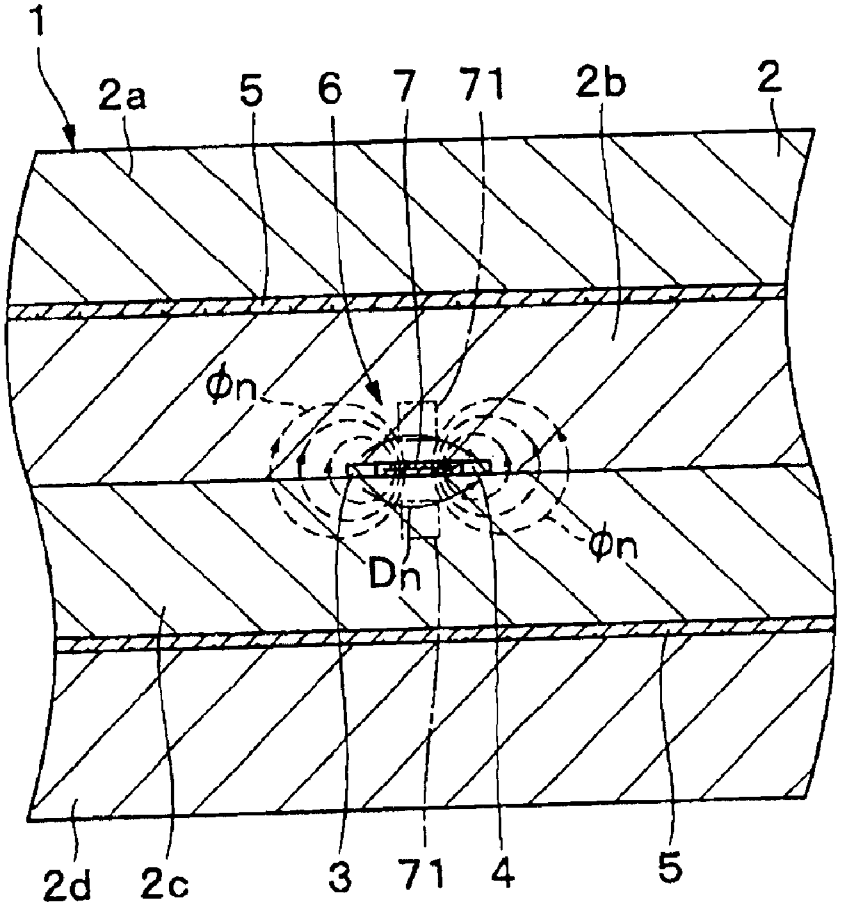
FIG. 3 is a sectional view taken on line III—III of FIG. 1 illustrating the noise filter while a normal-mode signal propagates.
Figure 4:
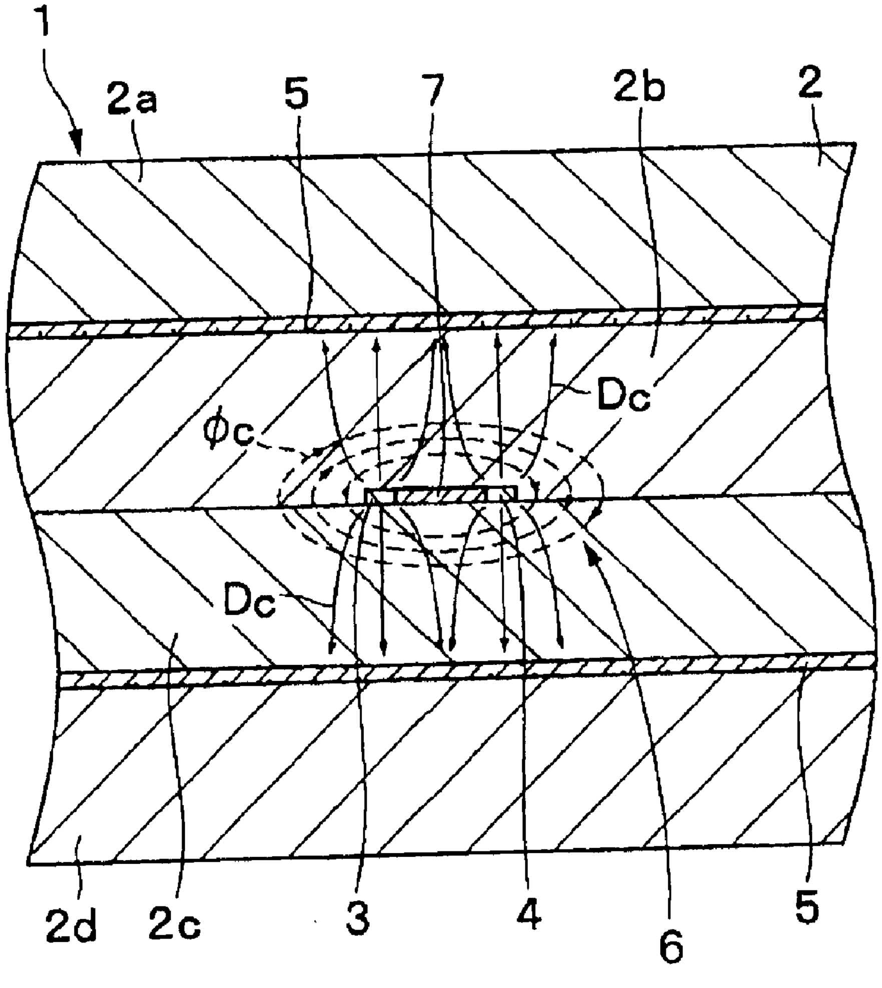
FIG. 4 is a sectional view taken on line III—III of FIG. 1 illustrating the noise filter while a common-mode signal propagates.

It is shown in FIGS. 3 and 4 that the thickness of the dielectric member 7 is substantially the same as the signal lines 3 and 4. However, the present invention is not limited to such an arrangement, and, for example, in order to obtain a large difference in characteristics between the common mode and the normal mode, the thickness of the dielectric member 7 should be greater than that of the signal lines 3 and 4 to such a degree so as not to interfere with an electromagnetic field of the common mode.

Instead of the dielectric member 7, a magnetic member having a relative magnetic permeability less than the magnetic layers 2*b* and 2*c*, i.e., a low-magnetic-permeability magnetic member, may be used. A gap (space) may be provided between the signal lines 3 and 4 so as to define the member 7. It is not essential that the relative dielectric constant $\epsilon r\mathbf{1}$ of the dielectric member 7 be set to be the same as the relative dielectric constant $\epsilon r\mathbf{0}$ of the magnetic layers 2*b* and 2*c*. Alternatively, the relative dielectric constant $\epsilon r\mathbf{1}$ may be suitably set such that the characteristic impedance of the normal mode is a predetermined value.

The materials for the insulating medium (magnetic layers 2*a* through 2*d*) and the member 7 may be selected according to the application of the filter or the manufacturing steps thereof. More specifically, for the material of the insulating medium, a material such as a composite material in which scale-like pure iron powder is dispersed in a resin, Mn—Zi ferrite, Ni—Zn ferrite, or hexagonal ferrite (in order of increasing noise-suppression frequency) may be selected. For the material of the member 7, it is desirable that a material having a relative magnetic permeability $\mu r\mathbf{1}$ of 1 ($\mu r1=1$) be selected in view of the characteristics. However, when considering damage to the member 7 due to the difference in the coefficients of the thermal expansion during firing between the member 7 and the insulating medium, the difference of the material characteristics therebetween should be small. Accordingly, as a combination of the member 7 and the insulating medium, glass and ferrite, or ferrite having low magnetic permeability and ferrite having high magnetic permeability may be selected.

The signal electrode terminals 8 and 9, which are provided at the four corners of the laminated unit 2, have an angular U shaped configuration, and are arranged at the end surfaces in the longitudinal direction of the laminated unit 2. The signal electrode terminals 8 and 9 cover both end portions along the width of the laminated unit 2 and also partially extend to the obverse and reverse surfaces of the laminated unit 2. The signal electrode terminals 8 and 9 are formed, for example, by coating the edges of the laminated unit 2 with a conductive metal material and by firing it so as to plate it. The signal electrode terminals 8 and 9 are connected to the electrode portions 3A and 4A of the signal lines 3 and 4, respectively.

The ground electrode terminals 10 are provided at the center positions in the longitudinal direction of the laminated unit 2, and are formed generally in an angular U shaped configuration. The ground electrode terminals 10 extend in a strip-like shape on the side surface along the thickness of the laminated unit 2, and partially extend to the obverse and reverse surfaces of the laminated unit 2. The ground electrode terminals 10 are formed, for example, by coating the side surfaces of the laminated unit 2 with a conductive metal material and by firing it to plate it. The ground electrode terminals 10 are connected to the electrode portions 5A of the ground electrodes 5.

The operation of the above-configured noise filter 1 is described below.

The noise filter 1 is provided on a substrate on which two wiring patterns through which differential signals are transmitted are provided. The signal electrode terminals 8 are connected to the mid-portion of one wiring pattern, and the signal electrodes 9 are connected to the mid-portion of the other wiring pattern. The ground electrode terminals 10 are connected to ground terminals. With this arrangement, signals are transmitted through the transmission line 6 defined by the signal lines 3 and 4 and the ground electrodes 5, and the ground electrodes 5 are maintained at a ground potential.

When a common-mode signal propagates in the signal lines 3 and 4, the directions of the currents supplied to the signal lines 3 and 4 are the same. In this case, since the signal lines 3 and 4 are disposed adjacent to each other, magnetic fluxes generated by the signal lines 3 and 4 are intensified, such that the signal lines 3 and 4 function as a single line for the common-mode signal. The signal lines 3 and 4 are disposed between the magnetic layers 2*b* and 2*c*. Accordingly, the transmission line 6 defined by the signal lines 3 and 4 and the ground electrodes 5 for the common-mode signal has inductors L, and capacitors C between the signal lines 3 and 4 and the ground electrodes 5 due to the dielectric constant of the magnetic layers 2*b* and 2*c*, as indicated by an equivalent circuit shown in FIG. 5.

That is, the signal lines 3 and 4 function equivalently as a distributed constant circuit, and a common-mode signal flowing in the signal lines 3 and 4 is transmitted without loss in a frequency range in which the inductors L and the capacitors C are maintained at constant values. When the frequency of the common-mode signal is increased, the magnetic permeability of the magnetic layers 2*b* and 2*c* is changed, resulting in the occurrence of loss R (magnetic loss) in the inductors L, as indicated by an equivalent circuit shown in FIG. 6. Accordingly, the common-mode signal in a high frequency range is attenuated due to magnetic loss.

Figure 5:
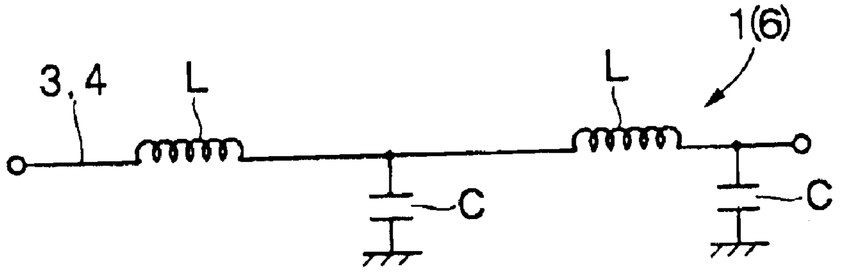
FIG. 5 is a circuit diagram illustrating an equivalent circuit of a transmission line with respect to the normal-mode signal.
Figure 6:
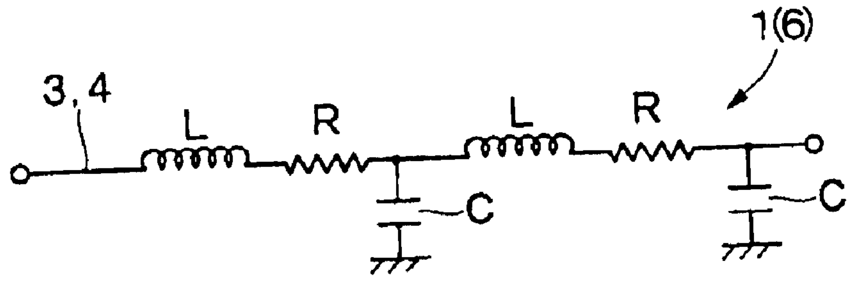
FIG. 6 is a circuit diagram illustrating an equivalent circuit of the transmission line with respect to a high-frequency common-mode signal.

In contrast, when a normal-mode signal propagates in the signal lines 3 and 4, the transmission line 6 indicated by the equivalent circuit shown in FIG. 5 is formed between the signal lines 3 and 4. In this case, the directions of the currents supplied to the signal lines 3 and 4 are opposite, and the current levels are substantially the same. Thus, magnetic fluxes generated by the signal lines 3 and 4 cancel each other out, and the inductors L and the loss R (magnetic loss) become less than those in the case of the common-mode signal.

However, when the signal lines 3 and 4 are formed in a uniform medium, the effective material characteristic is the same regardless of whether the common mode or the normal mode is used. That is, the ratio of the loss occurring in the common mode to that in the normal mode does not change over the entire frequency range. If it is desired that the signal be allowed to pass through the filter, the noise suppression effect should be reduced. Conversely, if it is desired that the noise suppression effect be enhanced, the attenuation of the signal is increased.

In this preferred embodiment, the dielectric member 7 having the constant magnetic permeability $\mu r\mathbf{1}$, which is less than the constant magnetic permeability $\mu r\mathbf{0}$ of the magnetic layers 2*b* and 2*c*, is disposed between the signal lines 3 and 4. Accordingly, magnetic fluxes ϕn generated in the normal mode pass through (transverse) the dielectric member 7, as shown in FIG. 3. In contrast, a magnetic flux ϕc generated in the common mode does not pass through the dielectric member 7, as shown in FIG. 4. Accordingly, in the path of the magnetic fluxes ϕn generated in the normal mode, the effective relative magnetic permeability $\mu wn$ is reduced by providing the dielectric member 7. Conversely, in the path of the magnetic flux ϕc generated in the common mode, the effective relative magnetic permeability $\mu wc$ is not decreased.

Therefore, in this preferred embodiment, the dielectric member 7 is located at a position where only an electromagnetic field substantially generated by normal-mode signal is present, and an electromagnetic field substantially generated by common-mode signal is not present.

Figure 7:
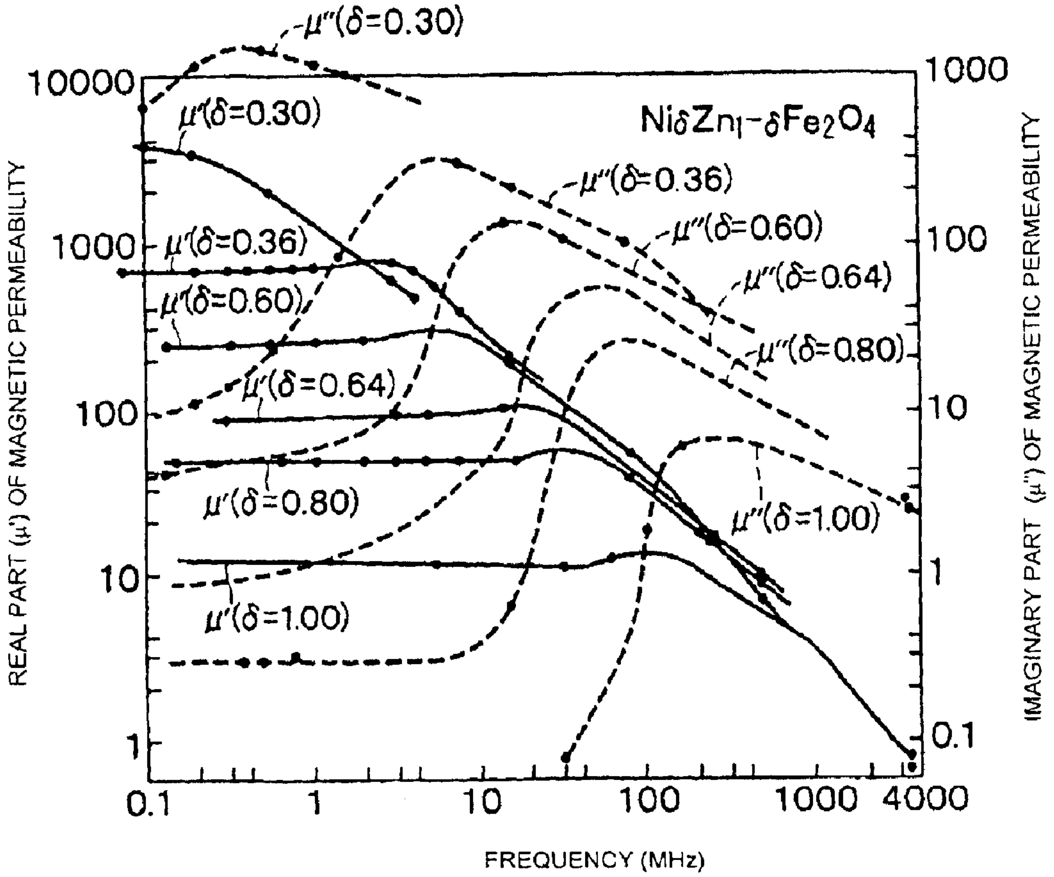
FIG. 7 is a characteristic diagram illustrating the real part and the imaginary part of the magnetic permeability with respect to the frequency.
Figure 8:
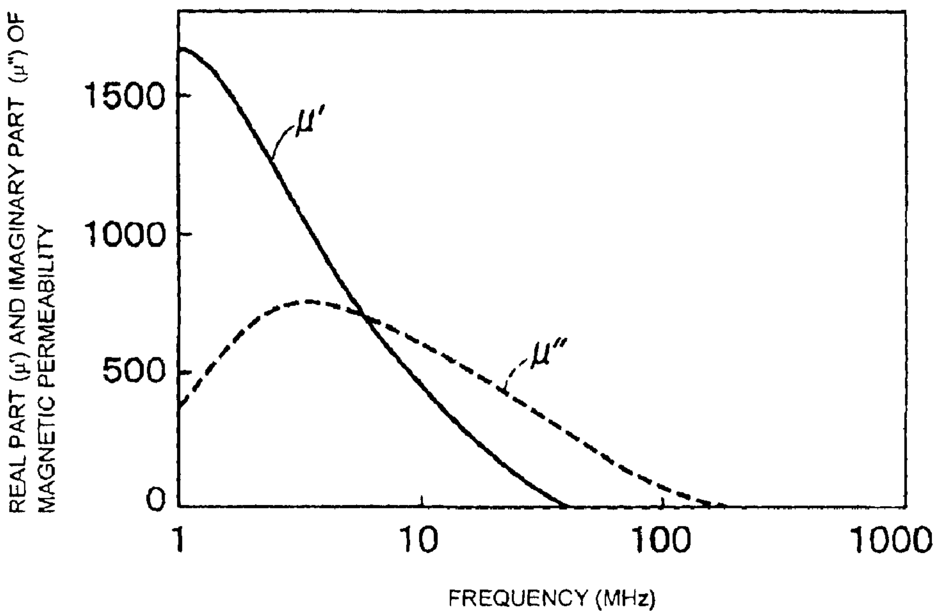
FIG. 8 is a characteristic diagram illustrating the real part and the imaginary part of the magnetic permeability with respect to the frequency when the noise filter is not provided with a dielectric member.
Figure 9:
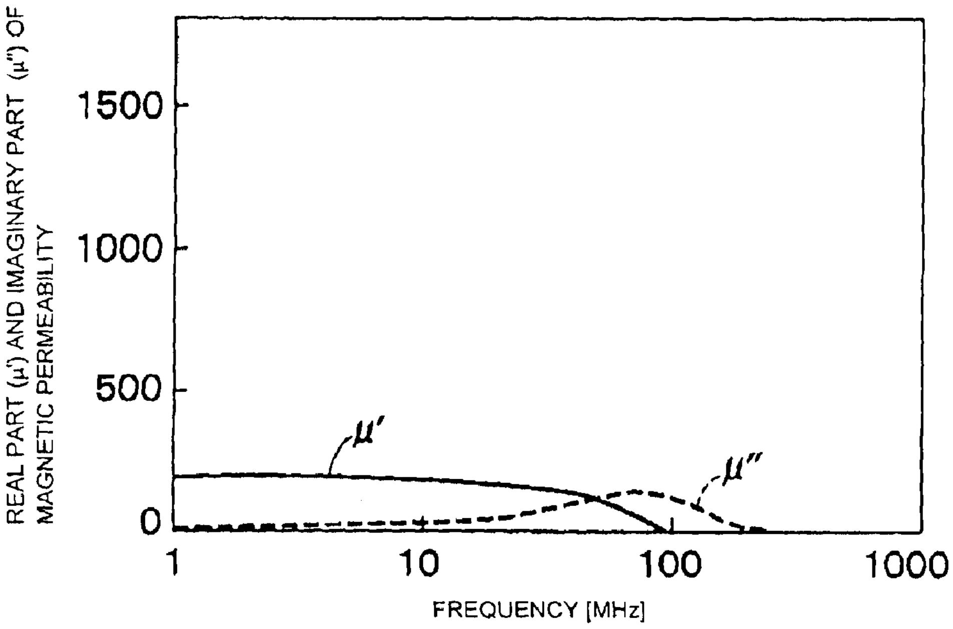
FIG. 9 is a characteristic diagram illustrating the real part and the imaginary part of the magnetic permeability with respect to the frequency when the noise filter is provided with a dielectric member.

Generally, as shown in FIG. 7, as the effective relative magnetic permeability decreases, the frequency corresponding to the loss peak (frequency at which the real part $\mu'$ and the imaginary part $\mu''$ of the effective relative magnetic permeability become the same) is shifted to a higher range. Accordingly, without the dielectric member 7, the loss peak occurs at several megahertz, as shown in FIG. 8. In contrast, with the dielectric member 7, the loss peak occurs at several tens of megahertz, as shown in FIG. 9. In this case, when the dielectric member 7 is provided, the magnitude of the loss itself determined by the ratio of the imaginary part $\mu''$ to the real part $\mu'$ ($\mu''/\mu'$) of the magnetic permeability and the magnitude of the real part $\mu'$ is less than the magnetic permeability without the dielectric member 7.

Accordingly, for the normal-mode signal, the frequency at which the magnetic loss R peaks is increased, and the magnetic loss R itself also is decreased. Thus, the normal-mode signal propagates without being attenuated up to the high frequency range, while the common-mode signal is removed in the low frequency range. Therefore, the normal-mode signal, which is a required mode, is transmitted without causing blunt waves. Accordingly, the noise suppression effect is greatly enhanced while maintaining the waveform quality.

By suitably setting the width of each of the signal lines 3 and 4 and the thickness of the magnetic layers 2*b* and 2*c* (distance between the ground electrodes 5), the characteristic impedance of each of the signal lines 3 and 4 can be set. By setting the distance between the signal lines 3 and 4, the characteristic impedance of the normal mode can be set. In the frequency range in which the relative dielectric constant and the relative magnetic permeability of the material for the magnetic layers are constant, the above-described characteristic impedances is maintained substantially at constant values. Accordingly, by setting the material characteristics such that the signal frequency is contained within the above-described frequency range, impedance matching to a circuit connected to the noise filter 1 is provided. Thus, the reflection loss of the noise filter 1 is reduced, thereby suppressing the noise caused by resonance and the distortion of the signal waveform.

As described above, the signal lines 3 and 4 are arranged between the two magnetic layers 2*b* and 2*c*, and the magnetic layers 2*b* and 2*c* are sandwiched by the two ground electrodes 5. With this arrangement, the transmission line 6 can be formed by covering the entire lengths of the signal lines 3 and 4 arranged between the magnetic layers 2*b* and 2*c* with the two ground electrodes 5. Accordingly, the common-mode characteristic impedance can be set to a constant value over the entire length of the transmission line 6, thereby preventing noise from being reflected in the transmission line 6 and preventing noise resonance. Since the entire lengths of the signal lines 3 and 4 are covered with the two ground electrodes 5, noise is prevented from entering the signal lines 3 and 4 from the exterior, thereby enhancing the transmission reliability of the signal.

By providing the dielectric member 7, the normal-mode characteristic impedance and the common-mode characteristic impedance of the transmission line 6 can be individually set. Accordingly, for the common-mode characteristic impedance associated with common-mode noise, impedance matching to an external circuit to be connected to the noise filter 1 may be provided or impedance matching to the external circuit may not be provided while providing normal-mode characteristic impedance matching for the external circuit. When common-mode characteristic impedance matching is not provided, noise is suppressed by the reflection loss. When common-mode characteristic impedance matching is not provided, noise is suppressed by thermal loss in the magnetic layers 2*b* and 2*c* while preventing problems, for example, resonance, caused by the reflection.

Regardless of whether or not common-mode characteristic impedance matching is provided, the common-mode characteristic impedance can be set independently of the normal-mode characteristic impedance. Thus, the transmission loss for the common-mode signal can be increased as compared to the related art by utilizing the reflection loss and/or thermal loss. In particular, according to this preferred embodiment, there is no insertion-loss resonance point in the high frequency range (several hundred megahertz or higher), which is observed in the related art, thereby making it possible to attenuate noise up to about 10 GHz. Additionally, by suitably setting the width of the signal lines 3 and 4, the thickness of the magnetic layers 2*b* and 2*c*, and the material characteristics, normal-mode characteristic impedance matching to an external circuit is provided more easily than in the related art, thereby making it possible to reduce the influence of resonance on signal waveforms.

In this preferred embodiment, when the frequency of common-mode noise is low, the noise filter 1 allows the common-mode noise to pass therethrough, and thus, it functions as a low-pass filter. That is, the noise filter 1 has a pass band and an attenuation band for the common-mode noise according to the frequency. The pass band and the attenuation band are determined by adjusting the composition (relative magnetic permeability) of the magnetic material for the magnetic layers 2*b* and 2*c* and the lengths of the signal lines 3 and 4. Thus, considering the frequency of common-mode noise, the composition of the material for the magnetic layers 2*b* and 2*c* and the lengths of the signal lines 3 and 4 are set such that the common-mode noise is reliably attenuated.

According to this preferred embodiment, the signal lines 3 and 4 are disposed between the two magnetic layers 2*b* and 2*c*, and the magnetic layers 2*b* and 2*c* are covered with the two ground electrodes 5. With this configuration, it is possible to suppress common-mode noise by utilizing the magnetic loss (thermal loss) in the magnetic material for the magnetic layers 2*b* and 2*c*. By using the dielectric member 7, the effective relative magnetic permeability is decreased such that it can be maintained at a constant value up to the high frequency range. Accordingly, the normal-mode characteristic impedance of the signal lines 3 and 4 is maintained substantially at a constant value in a wide frequency range, thereby facilitating the provision of impedance matching to an external circuit. Thus, the reflection loss of the noise filter 1 is reduced, thereby preventing the noise from being intensified as a result of resonance and preventing distortion of the signal waveform.

Additionally, by providing the dielectric member 7 between the signal lines 3 and 4, the frequency characteristic of the effective relative magnetic permeability $\mu$wn with respect to the normal-mode signal can be changed without influencing the common-mode signal, thereby shifting the frequency at which the magnetic loss R peaks to a higher frequency range. Accordingly, the common-mode signal is eliminated at lower frequencies, and the normal-mode signal is transmitted without being attenuated up to the high frequency range. As a result, the quality of waveforms is maintained for the normal-mode signal by preventing blunt waves without decreasing the noise suppression effect for the common-mode signal.

The signal lines 3 and 4 positioned between the magnetic layers 2*b* and 2*c* are entirely covered with the two ground electrodes 5. Accordingly, the common-mode characteristic impedance is set to a constant value over the entire length of the transmission line 6 defined by the signal lines 3 and 4 and the ground electrodes 5. As a result, noise is prevented from being reflected in the transmission line 6 and is also prevented from entering the transmission line 6 from the exterior, thereby allowing the signal to be reliably transmitted.

By providing the dielectric member 7, the normal-mode characteristic impedance and the common-mode characteristic impedance of the transmission line 6 can be individually set. Accordingly, for the common-mode characteristic impedance associated with common-mode noise, impedance matching to an external circuit may be provided or impedance matching to the external circuit may not be provided while providing normal-mode impedance matching to the external circuit. Regardless of whether or not common-mode impedance matching is provided, the transmission loss for the common-mode signal can be increased by using the reflection loss and/or thermal loss compared to the related art. In particular, according to this preferred embodiment, there is no insertion-loss resonance point in the high frequency range (several hundred megahertz or higher), which is observed in the related art, thereby making it possible to attenuate the noise up to about 10 GHz. Normal-mode characteristic impedance matching to an external circuit is easily provided, thereby reducing the influence of, for example, resonance, on the waveform of the normal-mode signal.

The magnetic layers 2*a* through 2*d* are preferably formed in the generally shape of a quadrilateral, and the signal electrode terminals 8 and 9 respectively connected to the ends 3A and 4A of the signal lines 3 and 4 are provided at both ends in the longitudinal direction of the magnetic layers 2*a* through 2*d*. The ground electrode terminals 10 connected to the ground terminals 5 are disposed at the intermediate portions in the longitudinal direction of the magnetic layers 2*a* through 2*d*. With this configuration, the signal electrode terminals 8 and 9 are easily connected to the mid-portions of longitudinally extending wiring patterns. The ground electrode terminals 10 are also easily connected to ground terminals, which are disposed around the wiring patterns. Thus, the assembly of the noise filter 1 is greatly simplified.

Since the signal lines 3 and 4 are formed in a zigzag manner (meandering), the lengths of the signal lines 3 and 4 are increased, thereby increasing the attenuation of noise.

Figure 10:
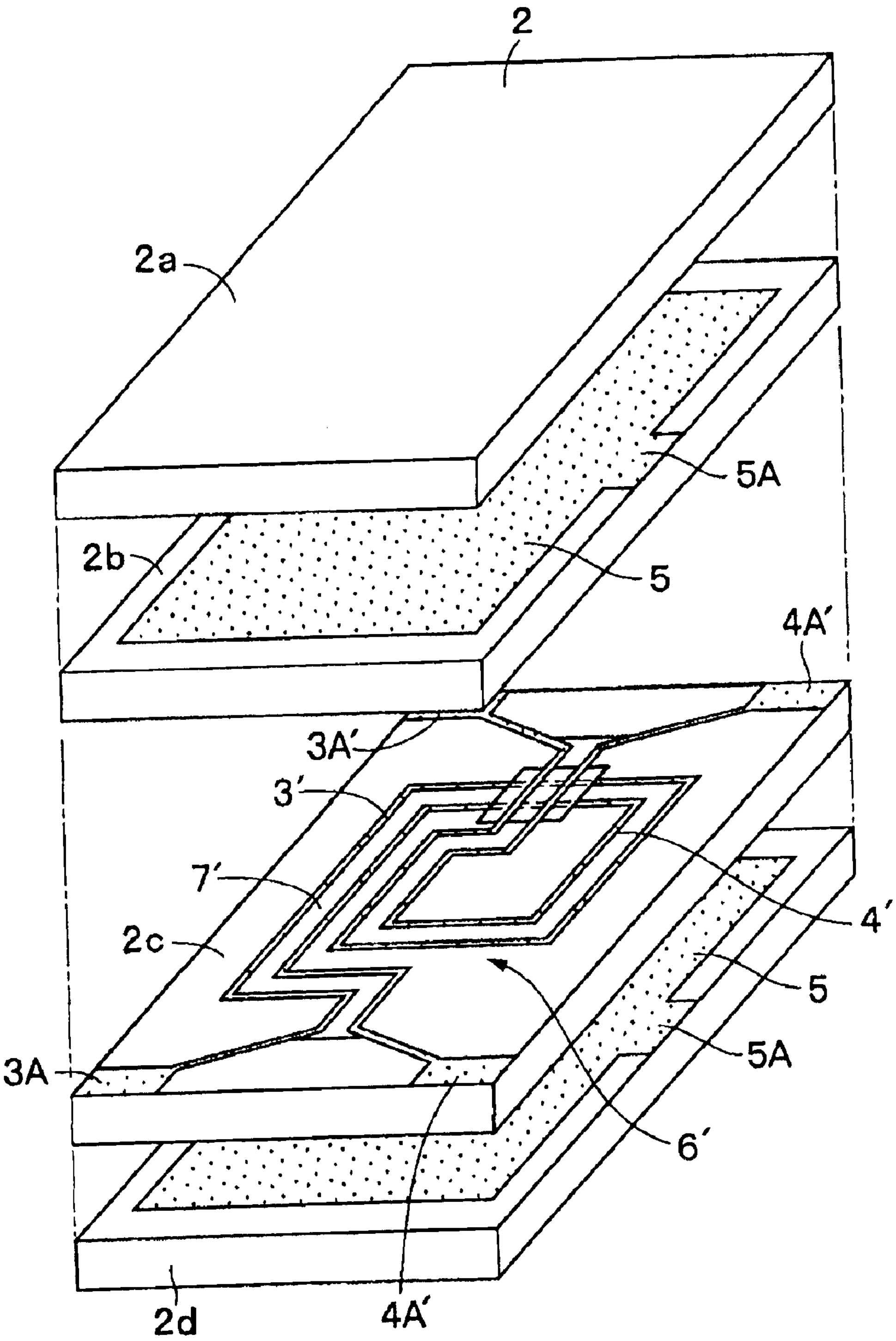
FIG. 10 is an exploded perspective view illustrating a noise filter constructed in accordance with a first modified example.
Figure 11:
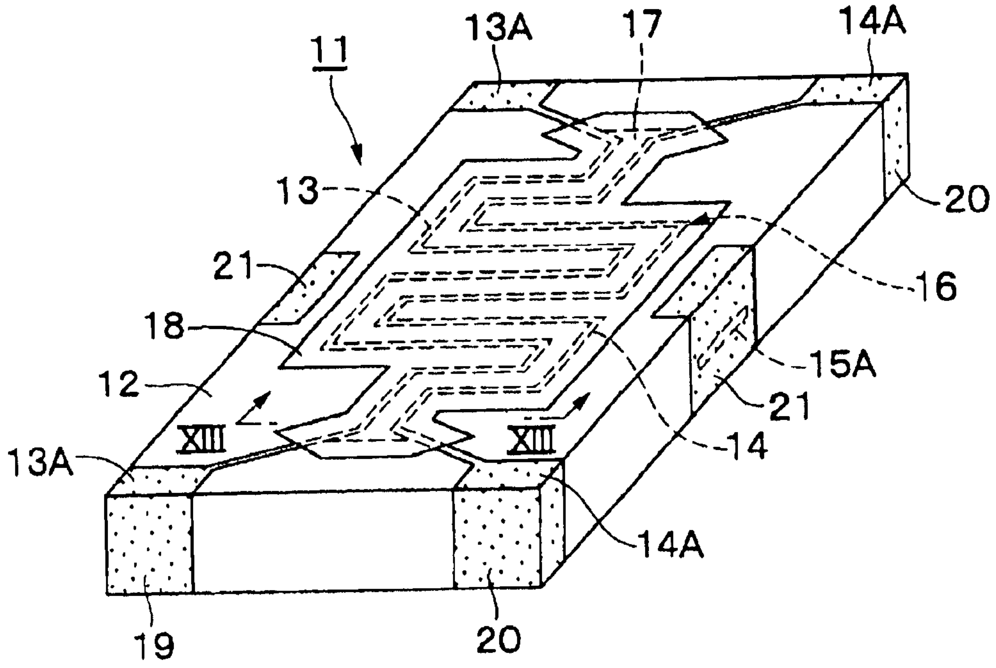
FIG. 11 is a perspective view illustrating a noise filter constructed in accordance with a second preferred embodiment of the present invention.
Figure 12:
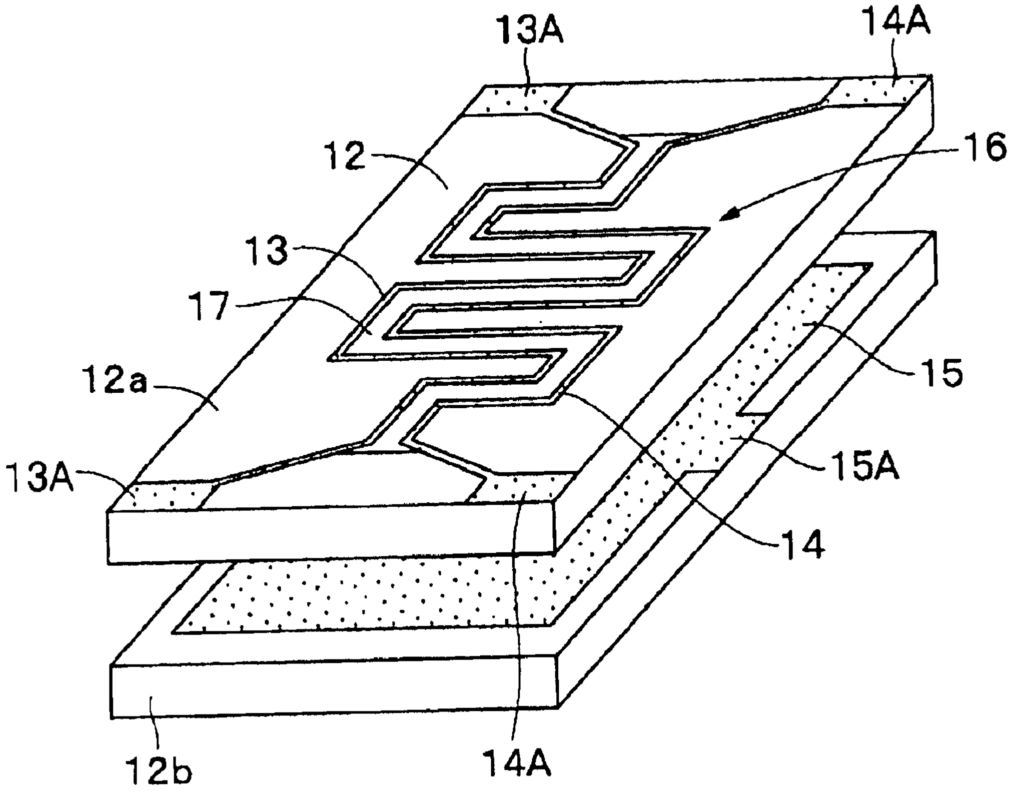
FIG. 12 is an exploded perspective view illustrating the noise filter shown in FIG. 11.

Although in the first preferred embodiment the signal lines 3 and 4 are formed in a zigzag manner, signal lines 3' and 4' may be formed in a coil-like shape, as in a first modified example shown in FIG. 10.

A noise filter 11 constructed in accordance with a second preferred embodiment of the present invention is described below with reference to FIGS. 11 through 14. The features of the noise filter 11 of the second preferred embodiment are as follows. Two signal lines are disposed side by side on the obverse surface of a magnetic layer, and a ground electrode is disposed on the reverse surface of the magnetic layer. A dielectric member is provided between the two signal lines, and the two signal lines are coated with a coating film exhibiting magnetic characteristics.

The noise filter 11 includes magnetic layers 12*a* and 12*b*, signal lines 13 and 14, a ground electrode 15, a dielectric member 17, a coating film 18, signal electrode terminals 19 and 20, and ground electrode terminals 21, which are described below.

A laminated unit 12 is generally formed in the shape of a prism, which defines an insulating medium to form the outer shape of the noise filter 1. The laminated unit 12 is formed by firing the magnetic layers 12*a* and 12*b*. As in the first preferred embodiment, the magnetic layers 12*a* and 12*b* are formed generally in the shape of a flat quadrilateral (rectangle) by using, for example, ferrite.

The signal lines 13 and 14, which are disposed on the obverse surface of the magnetic layer 12*a*, extend substantially parallel to each other with a predetermined spacing therebetween while extending in the longitudinal direction of the magnetic layer 12*a* in a zigzag manner. As in the first preferred embodiment, the signal lines 13 and 14 are formed generally in a strip-like shape by using a conductive metal material. The reverse sides of the signal lines 13 and 14 are substantially entirely covered with the ground electrode 15, which is described below, so as to form a transmission line 16. The signal lines 13 and 14 define electrode portions 13A and 14A, respectively, at the ends thereof so as to be connected to the signal electrode terminals 19 and 20, respectively.

The ground electrode 15, which is disposed on the reverse surface of the magnetic layer 12*a* (between the magnetic layers 12*a* and 12*b*), is preferably formed generally in the shape of a flat quadrilateral by using a conductive metal material, and covers substantially the entire reverse surface of the magnetic layer 12*a*. Electrode portions 15A projecting in a tongue-like configuration in the widthwise direction of the ground electrode 15 are provided at the intermediate portions in the longitudinal direction of the magnetic layer 12*a*, and are connected to the ground electrode terminals 21, which are described below. The ground electrode 15 defines the transmission line 16 together with the magnetic layer 12*a* and the two signal lines 13 and 14.

The dielectric member 17 is a medium disposed between the signal lines 13 and 14, and is made of a material similar to that for the dielectric member 7 of the first preferred embodiment. The relative magnetic permeability $\mu r\mathbf{1}$ of the dielectric member 17 is less than the relative magnetic permeability $\mu r\mathbf{0}$ of the magnetic layer 12*a*, and is set to be, for example, about 1 ($\mu r1 \approx 1$). The relative dielectric constant $\epsilon r\mathbf{1}$ of the dielectric member 17 is set to be substantially the same as the relative dielectric constant $\epsilon r\mathbf{0}$ of the magnetic layer 12*a*. The dielectric member 17 fills the space between the two signal lines 13 and 14.

The coating film 18, which is disposed on the obverse surface of the laminated unit 12, is formed by mixing magnetic powder with a resin material. The coating film 18 has a relative magnetic permeability $\mu r\mathbf{2}$, which is approximately the same as the magnetic permeability $\mu r\mathbf{0}$ of the magnetic layer 12*a* and is greater than the relative magnetic permeability $\mu r\mathbf{1}$ of the dielectric member 17. The coating film 18 then covers the two signal lines 13 and 14 including the dielectric member 17.

The signal electrode terminals 19 and 20, which are provided at the four corners of the laminated unit 12, are formed generally in an angular U-shaped configuration using a conductive metal material, as in the first preferred embodiment, and are connected to the electrode portions 13A and 14A of the signal lines 13 and 14, respectively.

The ground electrode terminals 21, which are provided on both side surfaces in the widthwise direction and at the intermediate portions in the longitudinal direction of the laminated unit 12, and are formed generally in an angular U-shape using a conductive metal material, as in the first preferred embodiment, and are connected to the electrode portions 15A of the ground electrode 15.

Figure 13:
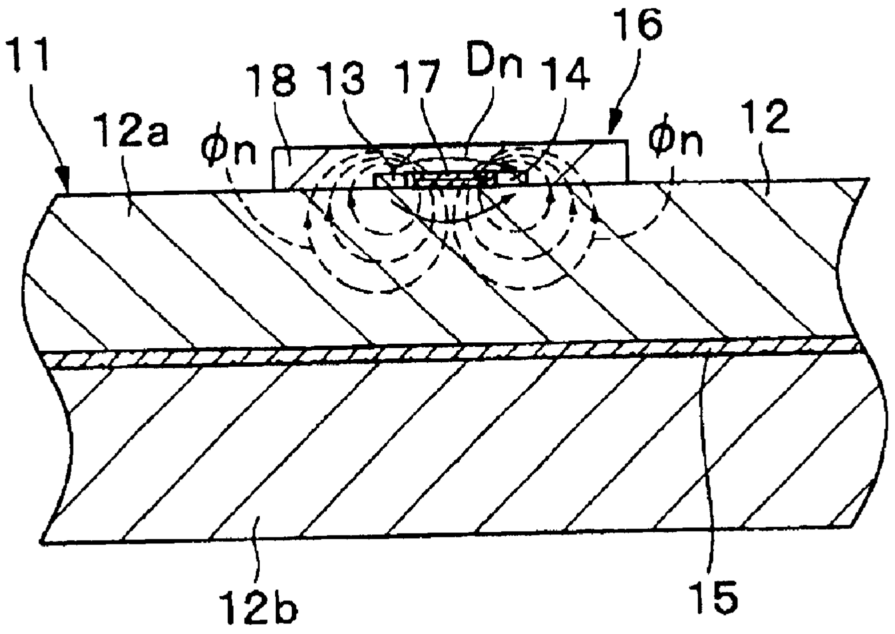
FIG. 13 is a sectional view taken on line XIII—XIII of FIG. 11 illustrating the noise filter while the normal-mode signal propagates.
Figure 14:
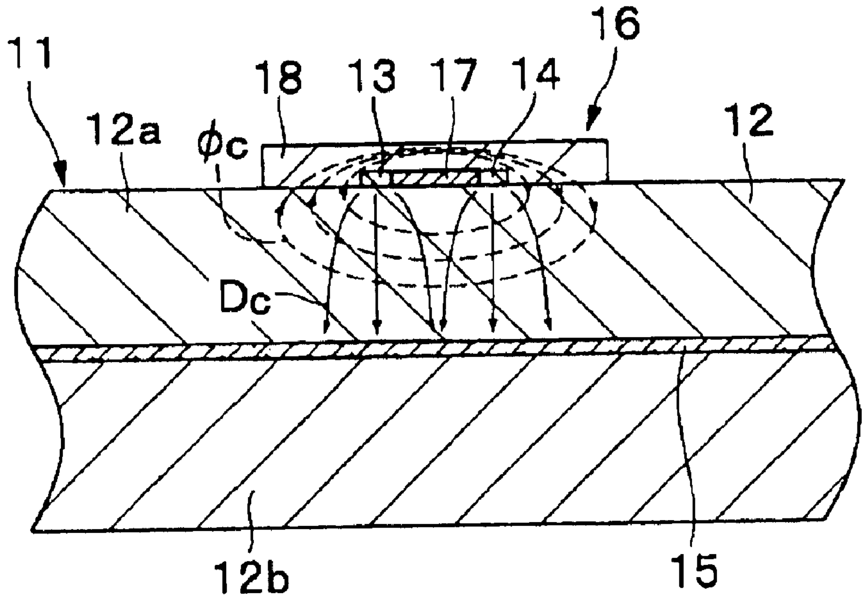
FIG. 14 is a sectional view taken on line XIII—XIII of FIG. 11 illustrating the noise filter while the common-mode signal propagates.

As in the first preferred embodiment, the dielectric member 17 is disposed between the two signal lines 13 and 14. Additionally, in the second preferred embodiment, the signal lines 13 and 14 and the dielectric member 17 are coated with the coating film 18. Accordingly, as shown in FIGS. 13 and 14, both in the normal mode and the common mode, magnetic fluxes $\phi n$ and $\phi c$ are trapped in the coating film 18 and the magnetic layer 12*a*, and also, the effective relative magnetic permeability $\mu wn$ of the normal mode is decreased without influencing the effective relative magnetic permeability $\mu wc$ of the common mode. Thus, advantages similar to those achieved by the first preferred embodiment are achieved.

The selection of the materials and the method for laying the wiring patterns are not restricted to those discussed in the second preferred embodiment, and various modifications can be made, as in the first preferred embodiment.

Figure 15:
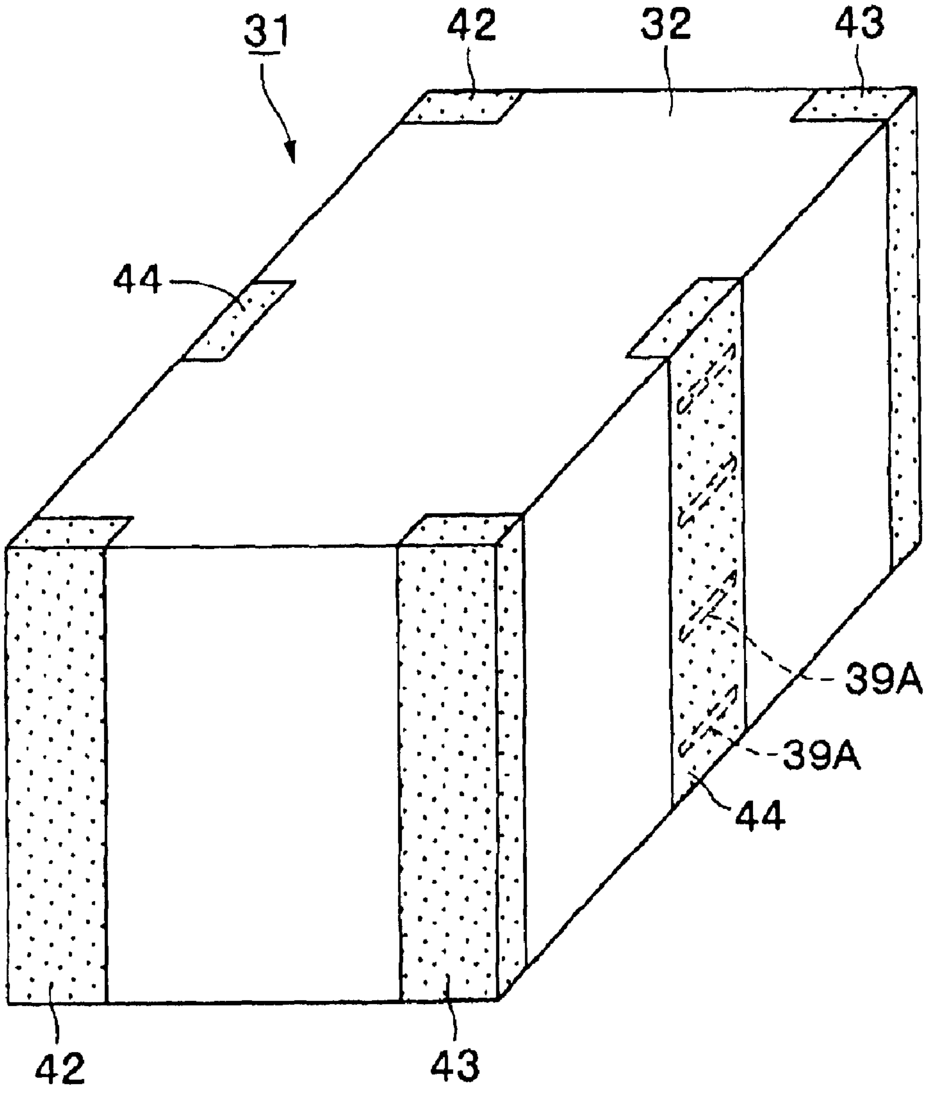
FIG. 15 is a perspective view illustrating a noise filter constructed in accordance with a third preferred embodiment of the present invention.
Figure 16:
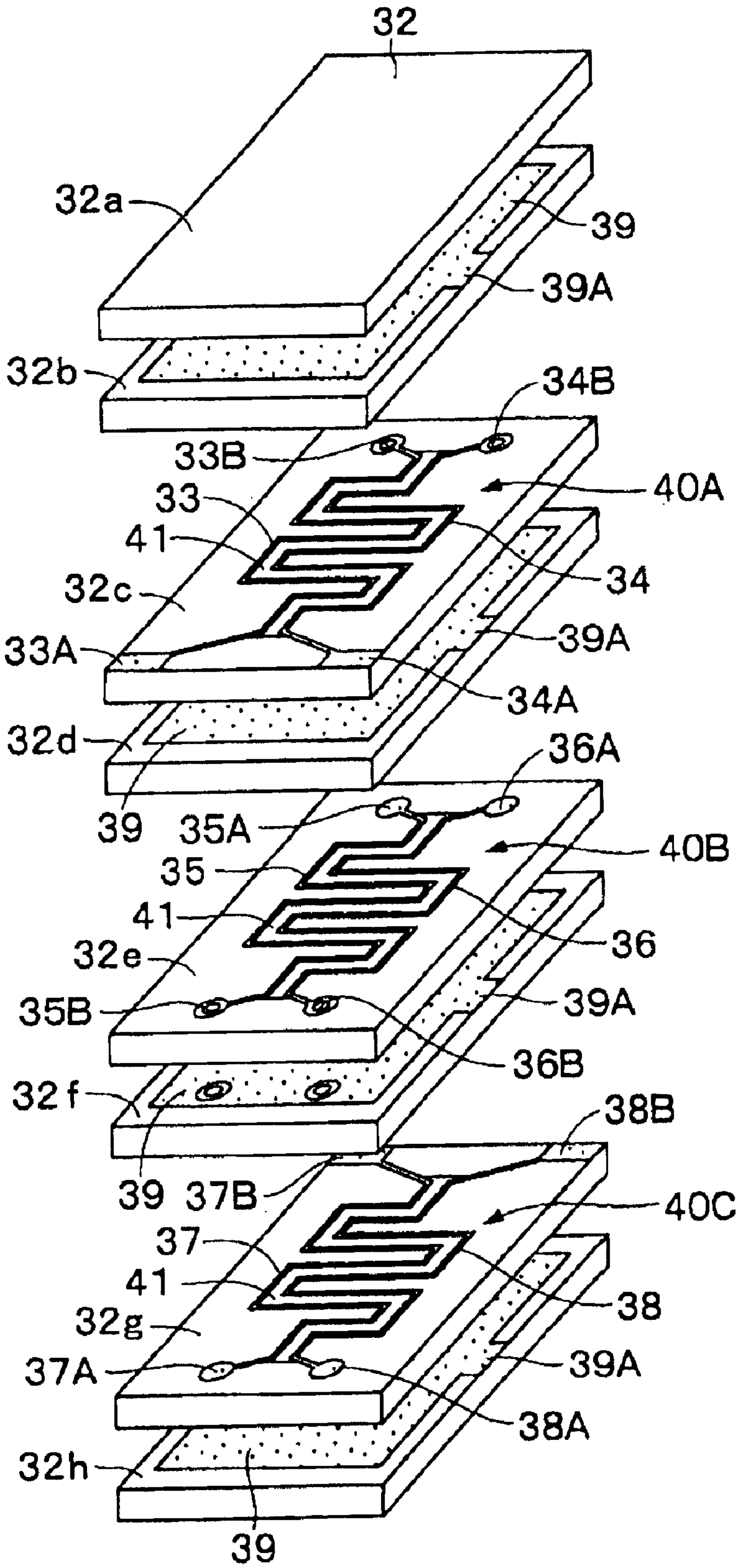
FIG. 16 is an exploded perspective view illustrating the noise filter shown in FIG. 15.
Figure 17:
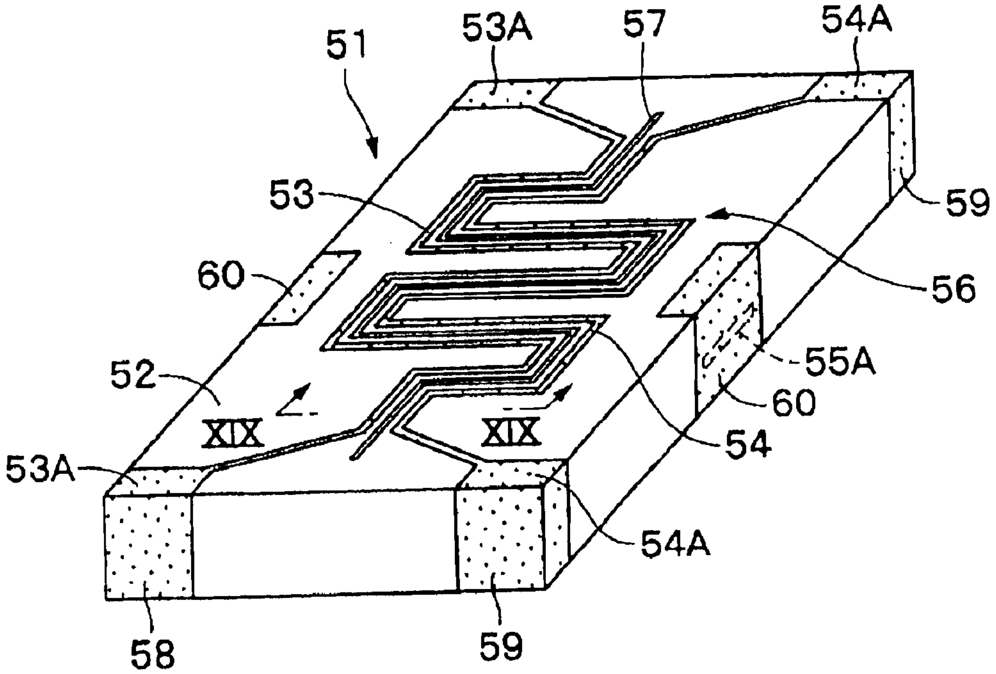
FIG. 17 is a perspective view illustrating a noise filter constructed in accordance with a fourth preferred embodiment of the present invention.
Figure 18:
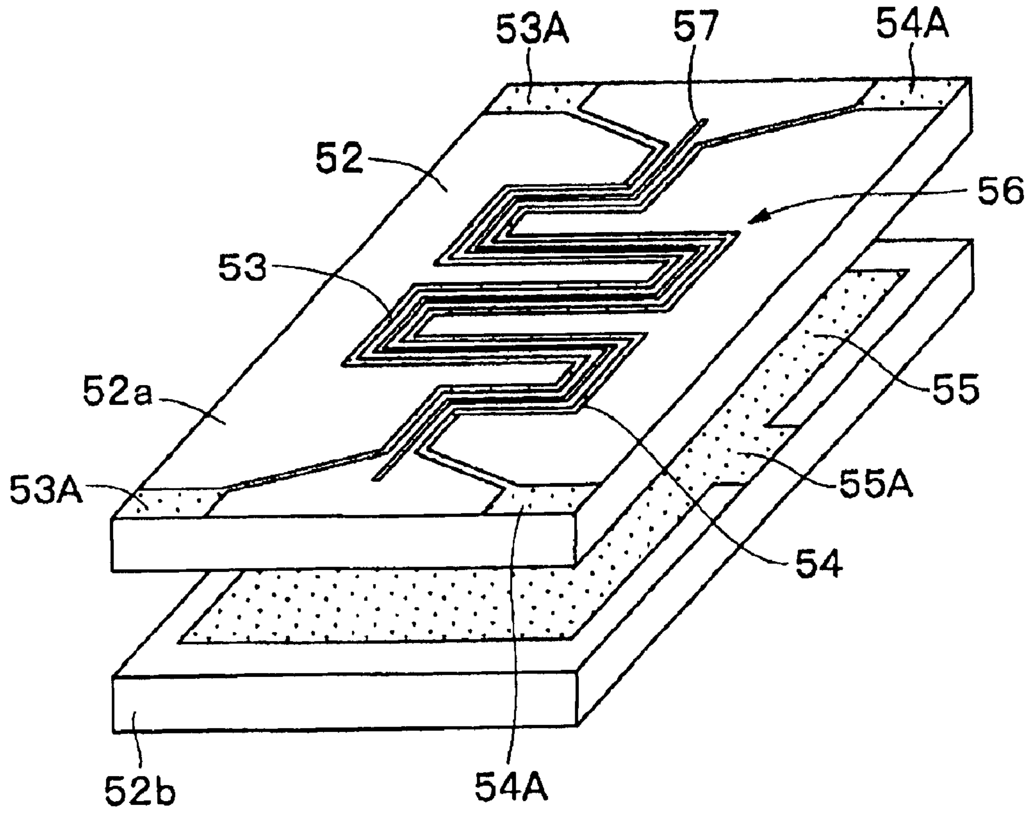
FIG. 18 is an exploded perspective view illustrating the noise filter shown in FIG. 17.

FIGS. 15 and 16 illustrate a noise filter 31 constructed in accordance with a third preferred embodiment of the present invention. The features of the noise filter 31 of the third preferred embodiment are as follows. A plurality of magnetic layers are overlaid on each other, first and second signal lines are disposed side by side with a gap therebetween between the magnetic layers, and two ground electrodes are disposed on the top surface and the bottom surface across the magnetic layers including the two signal lines define a transmission line. A plurality of (for example, two) layers of such transmission lines are laminated such that the first signal lines are connected in series with each other and the second signal lines are connected in series with each other between the transmission line layers, and a dielectric member is disposed between the first and second signal lines of each transmission line layer.

The noise filter 31 preferably includes magnetic layers 32*a* through 32*h*, first signal lines 33, 35, and 37, second signal lines 34, 36, and 38, ground electrodes 39, dielectric members 41, first and second signal electrode terminals 42 and 43, and ground electrode terminals 44, which are described below.

A laminated unit 32, which is preferably formed generally in the shape of a prism so as to define the outer shape of the noise filter 31, is formed by laminating the eight magnetic layers 32*a* through 32*h*. The magnetic layers 32*a* through 32*h* are preferably formed generally in the shape of a flat quadrilateral by using a ceramics material exhibiting magnetic characteristics, for example, ferrite, as in the magnetic layers 2*a* through 2*h* of the first preferred embodiment.

The first and second signal lines 33 and 34, which are provided between the magnetic layers 32*b* and 32*c*, are disposed substantially parallel to each other with a predetermined spacing therebetween in a zigzag manner by using a conductive metal material, as in the signal lines 3 and 4 of the first preferred embodiment. The signal lines 33 and 34 are covered with the two ground electrodes 39 disposed on the top surface of the magnetic layer 32*b* and the bottom surface of the magnetic layer 32*c*, thereby defining a first-layer transmission line 40A, which is described below.

One end of the first signal line 33 defines an electrode portion 33A extending toward one end in the longitudinal direction of the laminated unit 32, and one end of the second signal line 34 defines an electrode portion 34A toward the same end in the longitudinal direction of the laminated unit 32. The other ends of the first and second signal lines 33 and 34 are provided with through-holes 33B and 34B, respectively, away from the other ends in the longitudinal direction of the laminated unit 32 and passing through the magnetic layers 32*c* and 32*d*. A conductive material fills in the through-holes 33B and 34B, and the first and second signal lines 33 and 34 are connected in series with the first and second signal lines 35 and 36, respectively.

The first and second signal lines 35 and 36, which are provided between the magnetic layers 32*d* and 32*e*, extend substantially parallel to each other with a predetermined spacing therebetween in a zigzag manner by using a conductive metal material, as in the first and second signal lines 3 and 4 of the first preferred embodiment. The first and second signal lines 35 and 36 are covered with the two ground layers 39 provided on the top surface of the magnetic layer 32*d* and the bottom surface of the magnetic layer 32*e*, thereby forming a second-layer transmission line 40B, which is described below.

One end of the first signal line 35 defines a connecting portion 35A extending toward one end in the longitudinal direction of the laminated unit 32 and disposed at a position facing the through-hole 33B of the first signal line 33 such that the connecting portion 35A is connected to the first signal line 33. One end of the second signal line 36 defines a connecting portion 36A extending toward the same end in the longitudinal direction of the laminated unit 32 and disposed at a position facing the through-hole 34B such that the connecting portion 36A is connected to the second signal line 34. The other ends of the first and second signal lines 35 and 36 are respectively provided with through-holes 35B and 36B away from the other end in the longitudinal direction of the laminated unit 32 and passing through the magnetic layers 32*e* and 32*f*. A conductive material fills in the through-holes 35B and 36B, and the first and second signal lines 35 and 36 are respectively connected to the first and second signal lines 37 and 38, which are described below.

The first and second signal lines 37 and 38, which are provided between the magnetic layers 32*f* and 32*g*, extend substantially parallel to each other with a predetermined spacing therebetween in a zigzag manner by using a conductive metal material, as in the first and second signal lines 3 and 4 of the first preferred embodiment. The first and second signal lines 37 and 38 are covered with the two ground layers 39 provided on the top surface of the magnetic layer 32*f* and the bottom surface of the magnetic layer 32*g*, thereby forming a third-layer transmission line 40C, which is described below.

One end of the first signal line 37 forms a connecting portion 37A extending toward one end of the laminated unit 32 in the longitudinal direction and disposed at a position facing the through-hole 35B of the first signal line 35 such that the connecting portion 37A is connected to the first signal line 35. One end of the second signal line 38 forms a connecting portion 38A extending toward the same end in the longitudinal direction of the laminated unit 32 and disposed at a position facing the through-hole 36B such that the connecting portion 38A is connected to the second signal line 36. The other ends of the first and second signal lines 37 and 38 are respectively provided with electrode portions 37B and 38B extending toward the other end in the longitudinal direction of the laminated unit 32.

The widths of the signal lines 33 through 38 are set to be substantially the same, and the thickness dimensions of the magnetic layers 32*b* through 32*g* are set to be substantially the same. With this arrangement, the characteristic impedances of the first-, second-, and third-layer transmission lines 40A, 40B, and 40C are substantially equal to each other and are also substantially uniform over the entire lengths thereof.

The four ground electrodes 39 are provided between the corresponding pairs of magnetic layers 32*a* and 32*b*, 32*c* and 32*d*, 32*e* and 32*f*, and 32*g* and 32*h* such that they sandwich the corresponding first and second signal lines 33 through 38 therebetween. The ground electrodes 39 are disposed on the top surfaces of the magnetic layers 32*b*, 32*d*, 32*f*, and 32*h* and on the bottom surfaces of the magnetic layers 32*a*, 32*c*, 32*e*, and 32*g*. The ground electrodes 39 and the signal lines 33 through 38 are alternately laminated. Accordingly, two ground electrodes 39 sandwiching the magnetic layers 32*b* and 32*c* including the first and second signal lines 33 and 34 therebetween define the first-layer transmission line 40A. Two ground electrodes 39 sandwiching the magnetic layers 32*d* and 32*e* including the first and second signal lines 35 and 36 therebetween define the second-layer transmission line 40B. Two ground electrodes 39 sandwiching the magnetic layer 32*f* and 32*g* including the first and second signal lines 37 and 38 therebetween define the third-layer transmission line 40C.

The ground electrodes 39 are preferably formed generally in the shape of a flat quadrilateral by using a conductive metal material, and cover substantially the entire surfaces of the magnetic layers 32*b* through 32*g*. Electrode portions 39A projecting in a tongue-like configuration in the widthwise direction of the ground electrode 39 are provided, as in the ground electrodes 5 of the first preferred embodiment, and are connected to the ground electrode terminals 44, which are described below.

A dielectric member 41 is provided between the first and second signal lines 33 and 34, between the first and second signal lines 35 and 36, and between the first and second signal lines 37 and 38. The dielectric member 41 is preferably made of a material similar to that for the dielectric member 7 of the first preferred embodiment. The relative magnetic permeability $\mu r1$ of the dielectric member 41 is less than the relative magnetic permeability $\mu r0$ of the magnetic layers 32*b* through 32*g*, and is set to be, for example, about 1 ($\mu r1 \approx 1$). The relative dielectric constant $\epsilon r1$ of the dielectric member 41 is set to be substantially the same as the relative dielectric constant $\epsilon r0$ of the magnetic layers 32*b* through 32*g*. The dielectric member 41 fills in the spaces between the two signal lines 33 and 34, between the two signal lines 35 and 36, and the two signal lines 37 and 38.

The signal electrode terminals 42 and 43, which are provided at the four corners of the laminated unit 32, are formed generally in an angular U-shaped configuration by a conductive metal material, as in the first preferred embodiment. The signal electrode terminals 42 and 43 disposed at one end in the longitudinal direction of the laminated unit 32 are respectively connected to the electrode portions 33A and 34A of the first and second signal lines 33 and 34. The signal electrode terminals 42 and 43 disposed at the other end of the laminated unit 32 are respectively connected to the electrode portions 37A and 37B of the first and second signal lines 37 and 38.

The ground electrode terminals 44, which are provided on side surfaces in the widthwise direction and at the intermediate portions in the longitudinal direction of the laminated unit 32, are formed generally in an angular U-shaped configuration by a conductive metal material, as in the first preferred embodiment, and are connected to the electrode portions 39A of the ground electrode 39.

In the third preferred embodiment constructed as described above, advantages similar to those achieved by the first preferred embodiment are achieved. In the third preferred embodiment, however, the first signal lines 33, 35, and 37 are connected in series with each other, and the second signal lines 34, 36, and 38 are connected in series with each other. Accordingly, the entire length of the first signal lines and the entire length of the second signal lines are increased, thereby making it possible to increase the attenuation of noise.

The selection of the materials and the method for laying the wiring patterns are not limited to those discussed in the third preferred embodiment, and various modifications can be made, as in the first preferred embodiment. If the first and second signal lines are have a coil-like shape, and the length of the signal line positioned at the inner periphery is shorter than the length of the signal line positioned at the outer periphery. Accordingly, it is desired that the positions of the first and second signal lines be alternately changed in the layers such that the entire length of the first signal lines is substantially the same as that of the second signal lines.

FIGS. 17 through 20 illustrate a noise filter 51 constructed in accordance with a fourth preferred embodiment of the present invention. The features of the noise filter 51 of this preferred embodiment are as follows. Two signal lines are disposed side by side on the obverse surface of a dielectric layer, and a ground electrode is disposed on the reverse surface of the dielectric layer. An incision groove is provided between the two signal lines.

The noise filter 51 is defined by dielectric layers 52*a* and 52*b*, signal lines 53 and 54, a ground electrode 55, an incision groove 57, signal electrode terminals 58 and 59, and ground electrode terminals 60, which are described below.

A laminated unit 52, which is formed generally in the shape of a prism so as to define the outer shape of the noise filter 51, is formed by firing the dielectric layers 52*a* and 52*b*. The dielectric layers 52*a* and 52*b* preferably are formed generally in the shape of a flat quadrilateral by using a dielectric material, such as a ceramic material. The relative dielectric constant $\epsilon r2$ of the dielectric layers 52*a* and 52*b* is greater than 1 ($\epsilon r2>1$), and the relative magnetic permeability $\mu r2$ thereof is set to be about 1 ($\mu r2 \approx 1$).

The two signal lines 53 and 54, which are disposed on the obverse surface of the dielectric layer 52*a*, extend substantially parallel to each other with a predetermined spacing therebetween in the longitudinal direction of the dielectric layer 52*a* in a zigzag manner. The signal lines 53 and 54 preferably are formed generally in a strip-like shape by using a conductive metal material, as in the first preferred embodiment, and the reverse side of the signal lines 53 and 54 are substantially entirely covered with the ground electrode 55, which is described below, thereby forming a transmission line 56. The signal lines 53 and 54 include electrode portions 53A and 54A at both ends, and are respectively connected to the signal electrode terminals 58 and 59, which are described below.

The ground electrode 55, which is provided on the reverse surface of the dielectric layer 52*a* (between the dielectric layers 52*a* and 52*b*), is preferably formed generally in the shape of a quadrilateral by a conductive metal material, and covers substantially the entire surface of the dielectric layer 52*a*. Electrode portions 55A projecting in a tongue-like configuration in the widthwise direction of the ground electrode 55 are provided at the intermediate portions of the magnetic layer 52*a* in the longitudinal direction, and are connected to the ground electrode terminals 60, which are described below. The ground electrode 55 defines the transmission line 56 together with the dielectric layer 52*a* and the two signal lines 53 and 54.

The incision groove 57, which is provided between the two signal lines 53 and 54 on the obverse surface of the dielectric layer 52*a*, is arranged in a zigzag manner along the signal lines 53 and 54. The incision groove 57 is positioned substantially at the center between the signal lines 53 and 54 and has a predetermined depth toward the ground electrode 55. The depth of the incision groove 57 is such that an electric flux Dn of the normal mode passes through the incision groove 57 and such that an electric flux Dc does not pass through the incision groove 57. In the incision groove 57, a space 57A having a relative dielectric constant $\epsilon r3$ of about 1 and a relative magnetic permeability $\mu r3$ of about 1 is defined.

The signal electrode terminals 58 and 59, which are provided at the four corners of the laminated unit 52, are formed generally in an angular U-shaped configuration by a conductive metal material, as in the first preferred embodiment, and are respectively connected to the electrode portions 53A and 54A of the signal lines 53 and 54.

The ground electrode terminals 60, which are provided on both side surfaces in the widthwise direction and at the intermediate portions in the longitudinal direction of the laminated unit 52, are formed generally in an angular U-shaped configuration by a conductive metal material, as in the first preferred embodiment, and are connected to the electrode portions 55A of the ground electrode 55.

In the fourth preferred embodiment, the two signal lines 53 and 54 are disposed side by side on the obverse surface of the dielectric layer 52*a*, and the ground electrode 55 is provided on the reverse surface of the dielectric layer 52*a*. With this configuration, common-mode noise is suppressed by utilizing dielectric loss (thermal loss) by the provision of the dielectric layer 52*a*. Since the transmission line 56 is formed by covering the entire reverse side of the signal lines 53 and 54 with the ground electrode 55, the characteristic impedance can be set to a constant value over the entire transmission line 56. Accordingly, impedance matching to an external circuit is easily provided. It is also possible to prevent noise from being reflected in the transmission line 60 and from being intensified as a result of resonance.

Figure 19:
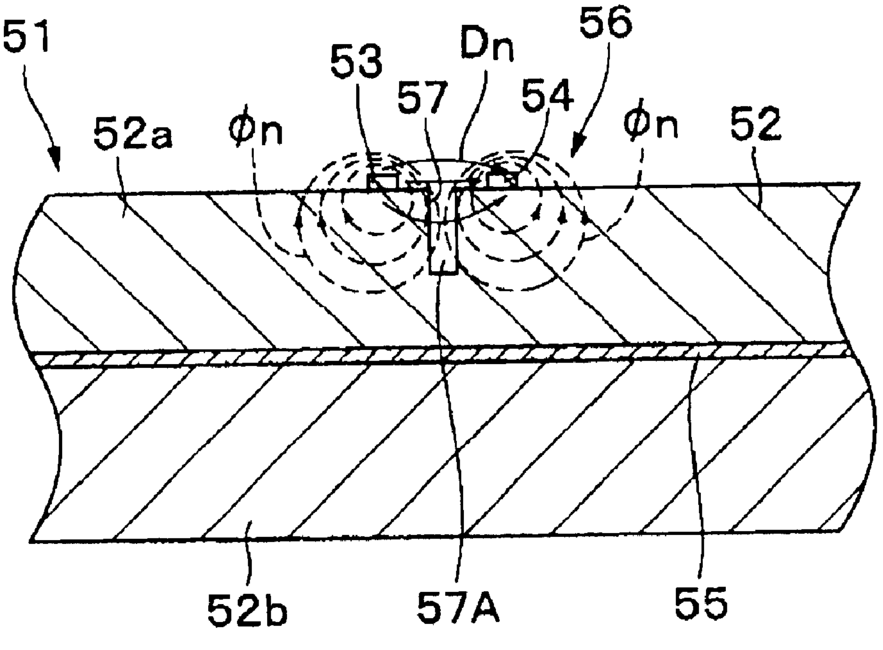
FIG. 19 is a sectional view taken on line XIX—XIX of FIG. 17 illustrating the noise filter while the normal-mode signal propagates.
Figure 20:
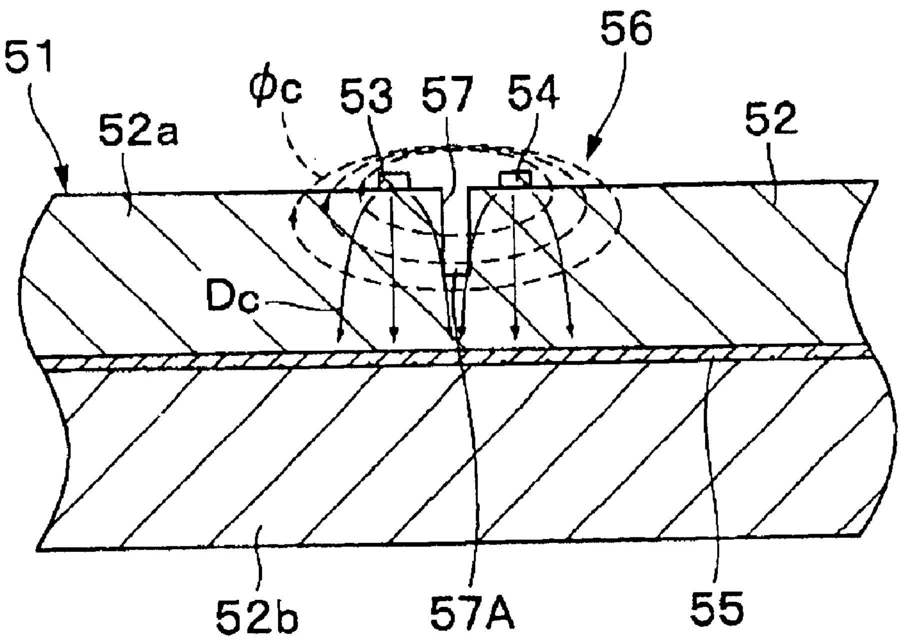
FIG. 20 is a sectional view taken on line XIX—XIX of FIG. 17 illustrating the noise filter while the common-mode signal propagates.

By providing the incision groove 57 between the two signal lines 53 and 54, the electric flux Dn generated in the normal mode passes through the space 57A in the incision groove 57, as shown in FIG. 19, while the electric flux Dc generated in the common mode does not pass through the space 57A, as shown in FIG. 20. Accordingly, by utilizing the space 57A, the effective relative dielectric constant of the normal mode $\epsilon wn$ is decreased without influencing the effective relative dielectric constant $\epsilon wc$ of the common mode. Thus, as in the first preferred embodiment, only the normal-mode loss is reduced, thereby enhancing the noise suppression effect without distorting the signal waveform.

In the fourth preferred embodiment, the obverse surface of the dielectric layer 52*a* is exposed. However, it may be coated with, for example, a resin material having a relative dielectric constant lower than the relative dielectric constant $\epsilon r2$ of the dielectric layer 52*a*.

The selection of the materials and the method for laying the wiring patterns are not limited to those discussed in the fourth preferred embodiment, and various modifications can be made, as in the first preferred embodiment.

Figure 21:
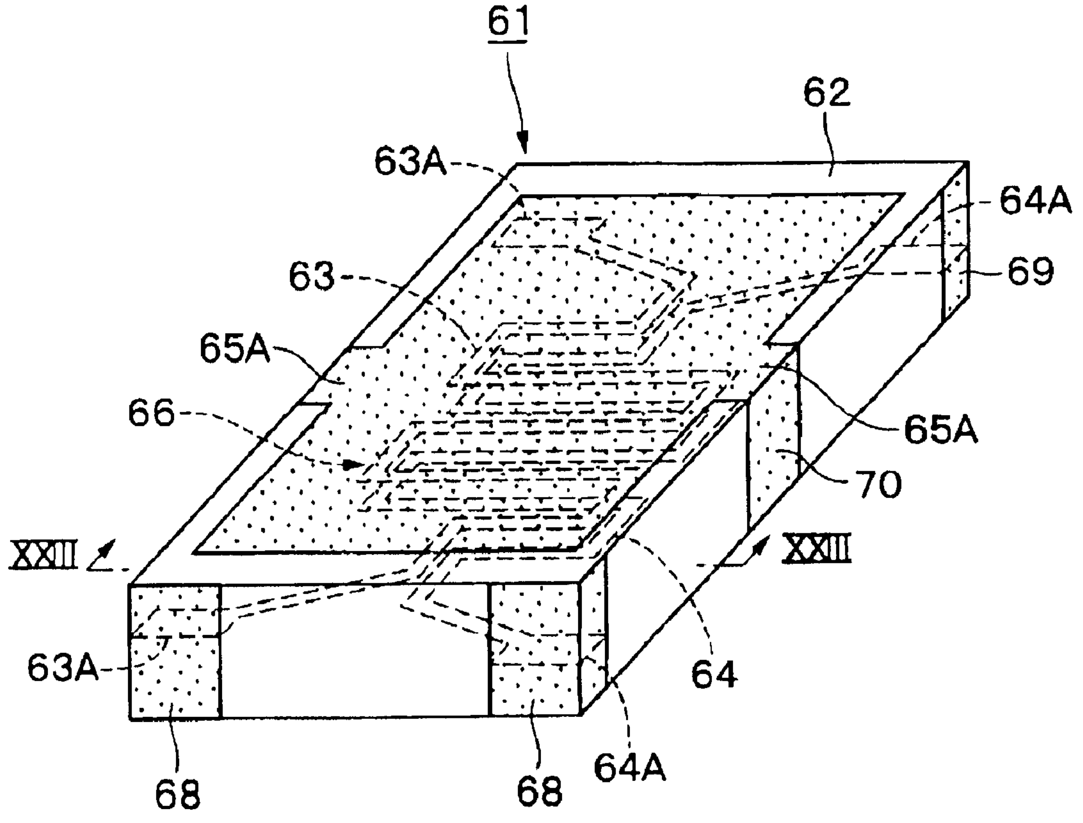
FIG. 21 is a perspective view illustrating a noise filter constructed in accordance with a fifth preferred embodiment of the present invention.
Figure 22:
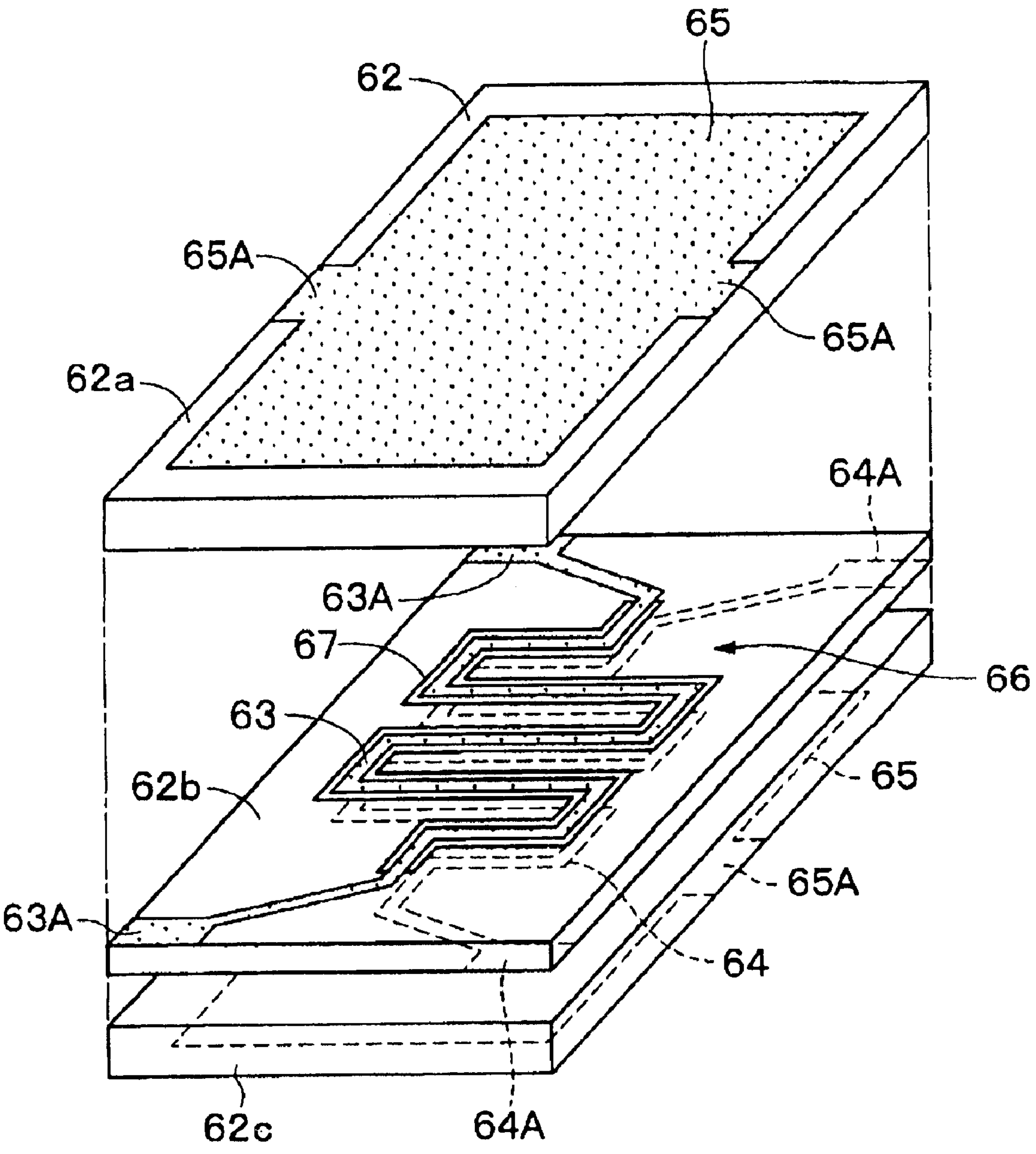
FIG. 22 is an exploded perspective view illustrating the noise filter shown in FIG. 21.
Figure 23:
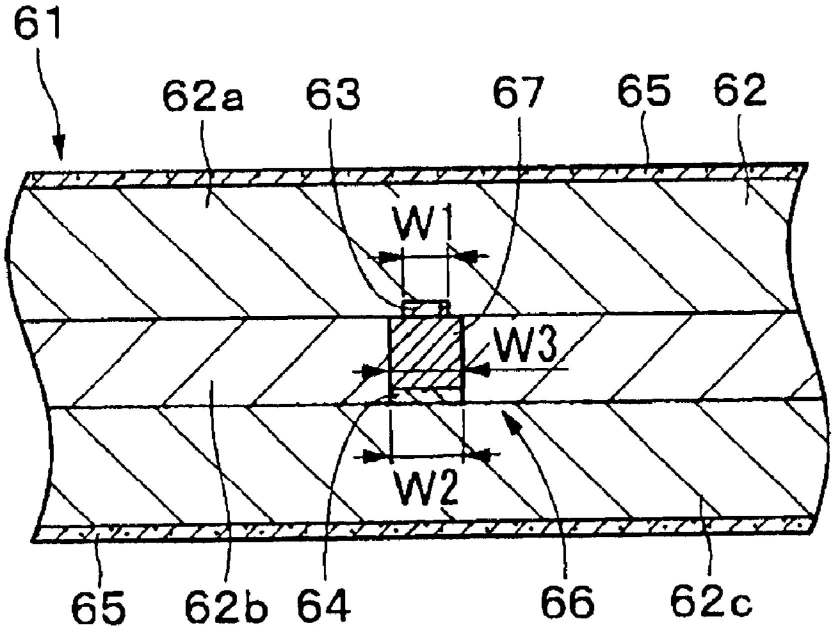
FIG. 23 is a sectional view taken on line XXIII—XXIII of FIG. 21.

FIGS. 21 through 23 illustrate a noise filter 61 constructed in accordance with a fifth preferred embodiment of the present invention. The features of the noise filter 61 of the fifth preferred embodiment are as follows. Three overlaid magnetic layers are provided, and two signal lines are disposed side by side across the intermediate magnetic layer. A ground electrode is provided on the top surface of the uppermost layer and on the bottom surface of the lowermost layer, thereby forming a transmission line.

The noise filter 61 includes magnetic layers 62*a* through 62*c*, signal lines 63 and 64, ground electrodes 65, a dielectric member 67, signal electrode terminals 68 and 69, and ground electrode terminals 70, which are described below.

A laminated unit 62, which is preferably formed generally in the shape of a prism so as to define the outer shape of the noise filter 61, is formed by the three magnetic layers 62*a* through 62*c*. The upper and lower magnetic layers 62*a* and 62*c* are made of, for example, ferrite, and the intermediate magnetic layer 62*b* is made of, for example, a magnetic composite material generated by kneading ferrite powder into polyimide. The magnetic layers 62*a* through 62*c* are formed generally in the shape of a flat quadrilateral (rectangle).

The two signal lines 63 and 64, which are disposed on the obverse surface and the reverse surface, respectively, of the intermediate magnetic layer 62*b*, face each other across the intermediate magnetic layer 62*b* and extend substantially parallel to each other with a predetermined spacing therebetween in the longitudinal direction of the magnetic layer 62*b* in a zigzag manner. The signal lines 63 and 64 are formed in a strip-like shape by a conductive metal material, as in the first preferred embodiment, and are substantially entirely covered with the ground electrodes 65, which are described below, thereby forming a transmission line 66. The signal lines 63 and 64 include electrode portions 63A and 64A, respectively, at both ends, which are connected to the signal electrode terminals 68 and 69, respectively, which are described below.

Widths W1 and W2 of the signal lines 63 and 64 may be set to be the same value or different values. By considering a displacement of the signal lines 63 and 64 while the noise filter 61 is being manufactured, the width W2 of the signal line 64 positioned on the reverse surface of the magnetic layer 62*b* may be set to be greater than the width W1 of the signal line 63 positioned on the obverse surface of the magnetic layer 62*b*.

The two ground electrodes 65, which are disposed on the obverse surface of the magnetic layer 62*a* and the reverse surface of the magnetic layer 62*c*, sandwich the laminated unit 62 from the top and the bottom. The ground electrodes 65 are preferably formed generally in the shape of a flat quadrilateral using a conductive metal material, and cover substantially the entire surfaces of the magnetic layers 62*a* and 62*c*. Electrode portions 65A projecting in a tongue-like configuration in the widthwise direction of the ground electrodes 65 are provided at the intermediate portions in the longitudinal direction of the magnetic layers 62*a* and 62*c*, and are connected to the ground electrode terminals 70, which are described below. The ground electrodes 65 define the transmission line 66 together with the magnetic layers 62*a* through 62*c* and the two signal lines 63 and 64.

The dielectric member 67, which is a medium made of a material that is different from a magnetic medium, for example, polyimide, is disposed between the signal lines 63 and 64. The relative magnetic permeability $\mu r1$ of the dielectric member 67 is less than the relative magnetic permeability $\mu r0$ of the magnetic layers 62*a* through 62*c*, and is set to be, for example, about 1 ($\mu r1 \approx 1$). The relative dielectric constant $\epsilon r1$ of the dielectric member 67 is set to be substantially the same as the relative dielectric constant $\epsilon r0$ of the magnetic layers 62*a* through 62*c*. The dielectric member 67 is arranged in the magnetic layer 62*b* in a zigzag manner along the two signal lines 63 and 64.

The width W3 of the dielectric member 67 is set to be the substantially same as the widths W1 and W2 of the signal lines 63 and 64. Alternatively, by considering the processing precision, the width W3 may be greater than the widths W1 and W2.

The signal electrode terminals 68 and 69, which are provided at the four corners of the laminated unit 62, are preferably formed using a conductive metal material, as in the first preferred embodiment, and are connected to the electrode portions 63A and 64A of the signal lines 63 and 64, respectively.

The ground electrode terminals 70, which are provided at both side surfaces in the widthwise direction and at the intermediate portions in the longitudinal direction of the laminated unit 62, are formed generally in an angular U-shaped configuration using a conductive metal material, as in the first preferred embodiment, and are connected to the electrode portions 65A of the ground electrode 65.

In the fifth preferred embodiment, advantages similar to those achieved by the first preferred embodiment are achieved.

The selection of the materials and the method for laying the wiring patterns are not limited to those described in this preferred embodiment, and various modifications can be made, as in the first preferred embodiment.

In the foregoing preferred embodiments, the signal lines 3, 4, 13, 14, 33 through 38, 53, 54, 63, and 64 are preferably arranged in a zigzag manner or in a coil-like shape. However, the present invention is not limited to these arrangements, and, for example, linear signal lines may be formed.

In the above-described preferred embodiments, the dielectric member 7, which is a medium made of a material different from a magnetic medium, is preferably disposed between two signal lines (for example, signal lines 3 and 4). The present invention is not limited to this arrangement. The dielectric member 7 may be provided in the presence of only one of an electromagnetic field substantially generated by the common-mode signal and an electromagnetic field substantially generated by the normal-mode signal. For example, as indicated by the one-dot-chain lines in FIG. 3, a medium 71 may be disposed in the thickness direction while extending from the signal lines 3 and 4 upward and downward by being separated from each other. In this case, the magnetic flux $\phi c$ in the common mode passes through the medium 71, while the magnetic fluxes $\phi n$ in the normal mode do not pass through the medium 71. Thus, a magnetic material having a relative magnetic permeability higher than that of the magnetic layers 2*b* and 2*c* can be selected for the medium 71, thereby making it possible to increase the loss of the common-mode signal without influencing the normal-mode signal.

In the second and third preferred embodiments, the dielectric members 17 and 41 formed of a non-magnetic medium are used. However, as described in the first preferred embodiment, a low-magnetic-permeability material or a space may be used.

Figure 24:
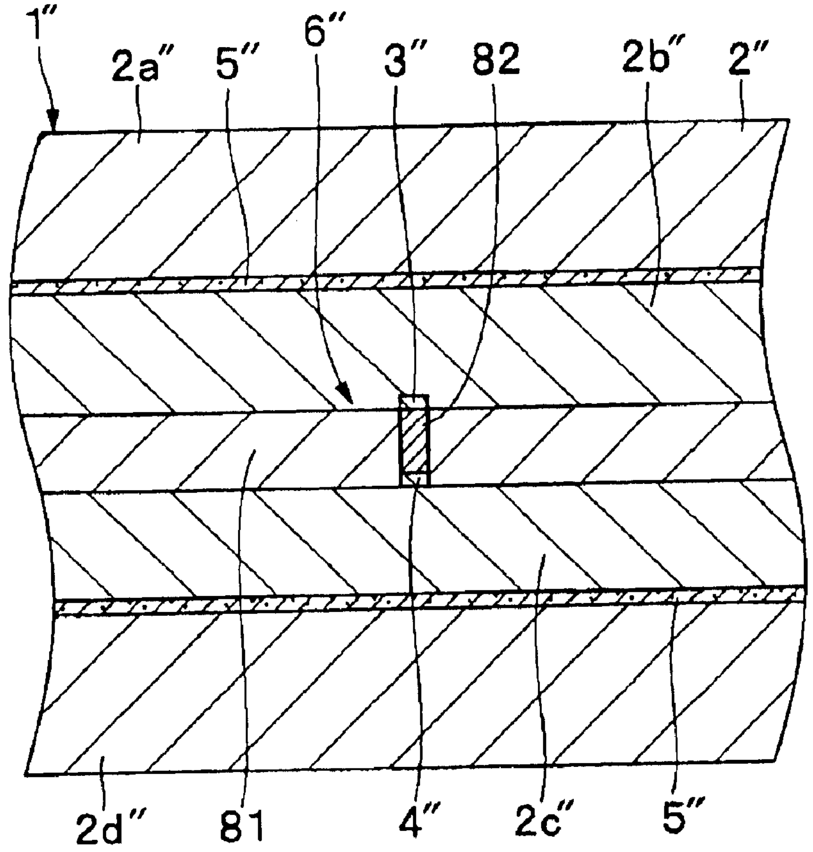
FIG. 24 is a sectional view illustrating a noise filter constructed in accordance with a second modified example.

Additionally, in the first through fourth preferred embodiments, two signal lines are preferably positioned in the same layer and are horizontally separated. However, as indicated by a second modified example shown in FIG. 24, two signal lines 3" and 4" may be positioned in different layers in a laminated unit 2" and may be separated from each other in the thickness direction. In this case, in a manner similar to the fifth preferred embodiment, a magnetic layer 81, which is formed of a magnetic material similar to magnetic layers 2_b_" and 2_c_", is disposed between the magnetic layers 2_b_" and 2_c_", and a medium made of a material different from the magnetic layers 2_b_" and 2_c_", for example, a dielectric member 82 is disposed between the signal line 3" and 4".

The present invention is not limited to each of the above-described preferred embodiments, and various modifications are possible within the range described in the claims. An embodiment obtained by appropriately combining technical means disclosed in each of the different preferred embodiments is included in the technical scope of the present invention.

What is claimed is:

1. A noise filter comprising:

a transmission line which includes an insulating medium made of an insulating material, at least two signal lines provided on the insulating medium with a spacing therebetween, and a ground electrode; wherein one of a common-mode signal in which the directions of currents flowing in the two signal lines are the same and a normal-mode signal in which the directions of currents flowing in the two signal lines are different is eliminated; and an additional medium which is made of a material that is different from the insulating medium is disposed provided in the presence of only one of an electromagnetic field substantially generated by the common-mode signal and an electromagnetic field substantially generated by the normal-mode signal, thereby adjusting loss of the common-mode signal or the normal-mode signal for which the additional medium is disposed.

2. A noise filter according to claim 1, wherein the additional medium is disposed between the two signal lines.

3. A noise filter according to claim 2, wherein the insulating medium is formed of a magnetic medium made of a magnetic material, and the additional medium is formed of one of a non-magnetic medium, a space, or a low-magnetic-permeability medium having a relative magnetic permeability smaller than the magnetic medium.

4. A noise filter according to claim 1, wherein the two signal lines have a meandering zigzag configuration.

5. A noise filter according to claim 1, wherein the two signal lines have a spiral shape configuration.

6. A noise filter comprising:

a transmission line which includes an insulating medium including a plurality of overlaid insulating layers, at least two signal lines disposed between the corresponding insulating layers with a spacing therebetween, and two ground electrodes sandwiching the corresponding insulating layers including the at least two signal lines; wherein one of a common-mode signal in which the directions of currents flowing in the two signal lines are the same and a normal-mode signal in which the directions of currents flowing in the two signal lines are different is eliminated; and an additional medium which is made of a material different from the insulating medium is provided in the presence of only one of an electromagnetic field substantially generated by the common-mode signal and an electromagnetic field substantially generated by the normal-mode signal, thereby adjusting loss of the common-mode signal or the normal-mode signal for which the additional medium is disposed.

7. A noise filter according to claim 6, wherein the additional medium is disposed between the two signal lines.

8. A noise filter according to claim 7, wherein the insulating medium is formed of a magnetic medium made of a magnetic material, and the additional medium is formed of one of a non-magnetic medium, a space, or a low-magnetic-permeability medium having a relative magnetic permeability smaller than the magnetic medium.

9. A noise filter according to claim 6, wherein the two signal lines have a meandering zigzag configuration.

10. A noise filter according to claim 6, wherein the two signal lines have a spiral shape.

11. A noise filter comprising:

a plurality of transmission lines, each of which includes an insulating medium including a plurality of overlaid insulating layers, first and second signal lines disposed between the corresponding insulating layers with a spacing therebetween, and at least two ground electrodes disposed on the uppermost surface and the lowermost surface of the transmission line by sandwiching the corresponding insulating layers including the first and second signal lines, the first signal lines being connected in series with each other and the second signal lines being connected in series with each other between the plurality of transmission lines; wherein one of a common-mode signal in which the directions of currents flowing in the two signal lines are the same and a normal-mode signal in which the directions of currents flowing in the two signal lines are different is eliminated; and an additional medium which is made of a material different from the insulating medium is provided in the presence of only one of an electromagnetic field substantially generated by the common-mode signal and an electromagnetic field substantially generated by the normal-mode signal, thereby adjusting loss of the common-mode signal or the normal-mode signal for which the additional medium is disposed.

12. A noise filter according to claim 11, wherein the additional medium is disposed between the first and second signal lines.

13. A noise filter according to claim 12, wherein the insulating medium is formed of a magnetic medium made of a magnetic material, and the additional medium is formed of one of a non-magnetic medium, a space, or a low-magnetic-permeability medium having a relative magnetic permeability smaller than the magnetic medium.

14. A noise filter according to claim 11, wherein the first and second signal lines have a meandering zigzag configuration.

15. A noise filter according to claim 11, wherein the first and second signal lines have a spiral shape.

16. A noise filter comprising:

a transmission line which includes a layered insulating medium, at least two signal lines disposed on the obverse surface of the insulating medium with a spacing therebetween, and a ground electrode disposed on the reverse surface of the insulating medium; wherein one of a common-mode signal in which the directions of currents flowing in the two signal lines are the same and a normal-mode signal in which the directions of currents flowing in the two signal lines are different is eliminated; and an additional medium which is made of a material different from the insulating medium is provided in the presence of only one of an electromagnetic field substantially generated by the common-mode signal and an electromagnetic field substantially generated by the normal-mode signal, thereby adjusting loss of the common-mode signal or the normal-mode signal for which the additional medium is disposed.

17. A noise filter according to claim 16, wherein the additional medium is disposed between the two signal lines.

18. A noise filter according to claim 17, wherein the insulating medium is formed of a magnetic medium made of a magnetic material, and the additional medium is formed of one of a non-magnetic medium, a space, or a low-magnetic-permeability medium having a relative magnetic permeability smaller than the magnetic medium.

19. A noise filter according to claim 16, wherein the insulating medium is formed of a dielectric medium made of a dielectric material, an incision groove is formed between the two signal lines on the obverse surface of the dielectric medium, and the additional medium is formed of a space defined in the incision groove.

20. A noise filter according to claim 16, wherein the insulating medium is formed of a magnetic medium made of a magnetic material, the additional medium is disposed between the two signal lines and is formed of one of a non-magnetic medium, a space, or a low-magnetic-permeability medium having a relative magnetic permeability smaller than the magnetic medium, and a coating film having a relative magnetic permeability higher than the additional medium covers the additional medium and the two signal lines.

21. A noise filter according to claim 16, wherein the two signal lines are arranged in a meandering zigzag configuration.

22. A noise filter according to claim 16, wherein the two signal lines are arranged in a spiral configuration.

* * * * *